United States Patent
Zhang et al.

(10) Patent No.: US 12,033,957 B2
(45) Date of Patent: Jul. 9, 2024

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Zhong Zhang, Wuhan (CN); Di Wang, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 391 days.

(21) Appl. No.: 17/384,116

(22) Filed: Jul. 23, 2021

(65) Prior Publication Data

US 2022/0399285 A1    Dec. 15, 2022

Related U.S. Application Data

(63) Continuation of application No. PCT/CN2021/099318, filed on Jun. 10, 2021.

(51) Int. Cl.
| | |
|---|---|
| *H01L 23/00* | (2006.01) |
| *H01L 21/768* | (2006.01) |
| *H01L 23/522* | (2006.01) |
| *H01L 23/528* | (2006.01) |
| *H10B 41/27* | (2023.01) |
| *H10B 43/27* | (2023.01) |

(52) U.S. Cl.
CPC ...... *H01L 23/562* (2013.01); *H01L 21/76816* (2013.01); *H01L 21/76877* (2013.01); *H01L 23/5226* (2013.01); *H01L 23/5283* (2013.01); *H10B 41/27* (2023.02); *H10B 43/27* (2023.02)

(58) Field of Classification Search
CPC ..................................................... H10B 41/10
See application file for complete search history.

(56) References Cited

U.S. PATENT DOCUMENTS

| | | | |
|---|---|---|---|
| 2017/0125437 A1 | 5/2017 | Pachamuthu et al. | |
| 2019/0221568 A1 | 7/2019 | Juengling | |
| 2019/0341399 A1* | 11/2019 | Tao | H10B 43/35 |
| 2020/0365617 A1 | 11/2020 | Ahn et al. | |
| 2021/0090992 A1 | 3/2021 | Li et al. | |

FOREIGN PATENT DOCUMENTS

| | | |
|---|---|---|
| CN | 1447438 A | 10/2003 |
| CN | 109075175 A | 12/2018 |
| CN | 109496356 A | 3/2019 |
| CN | 112543996 A | 3/2021 |
| CN | 112635481 A | 4/2021 |
| CN | 112740375 A | 4/2021 |

OTHER PUBLICATIONS

International Search Report issued in corresponding International Application No. PCT/CN2021/099318, mailed Mar. 9, 2022, 4 pages.

* cited by examiner

*Primary Examiner* — Yu-Hsi D Sun
(74) *Attorney, Agent, or Firm* — BAYES PLLC

(57) ABSTRACT

In certain aspects, a three-dimensional (3D) memory device includes a plurality of channel structures in a first region, a staircase structure in a second region, and a word line extending in the first region and the second region. The first region and the second region are arranged along a first direction. The word line is discontinuous in the first direction between the first region and the second region.

20 Claims, 13 Drawing Sheets

300

400

1400

THREE-DIMENSIONAL MEMORY DEVICES AND METHODS FOR FORMING THE SAME

CROSS-REFERENCE TO RELATED APPLICATIONS

This application is continuation of International Application No. PCT/CN2021/099318, filed on Jun. 10, 2021, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device includes a plurality of channel structures in a first region, a staircase structure in a second region, and a word line extending in the first region and the second region. The first region and the second region are arranged along a first direction. The word line is discontinuous in the first direction between the first region and the second region.

In another aspect, a 3D memory device includes a first stack structure including interleaved first conductive layers and first dielectric layers, a plurality of channel structures extending through the first stack structure, a second stack structure including interleaved second conductive layers and second dielectric layers, and a first cut structure between the first stack structure and the second stack structure. Edges of the interleaved second conductive layers and second dielectric layers of the second stack structure define a staircase. The first conductive layers of the first stack structure are partially separated from the second conductive layers of the second stack structure by the first cut structure.

In still another aspect, a system includes a 3D memory device configured to store data. The 3D memory device includes a plurality of channel structures in a first region, a staircase structure in a second region, and a word line extending in the first region and the second region. The first region and the second region are arranged along a first direction. The word line is discontinuous in the first direction between the first region and the second region. The system also includes a controller circuit coupled to the 3D memory device and configured to operate the plurality of channel structures via the word line.

In yet another aspect, a method for forming a staircase structure of a 3D memory device is disclosed. A stack structure includes interleaved first dielectric layers and second dielectric layers is formed. A plurality of channel structures are formed in a first region of the stack structure. A staircase structure is formed in a second region of the stack structure. A first portion of each of the second dielectric layers is replaced with a conductive layer, such that the conductive layer is partially separated between the staircase structure and the plurality of channel structures by a remainder of the second dielectric layer.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
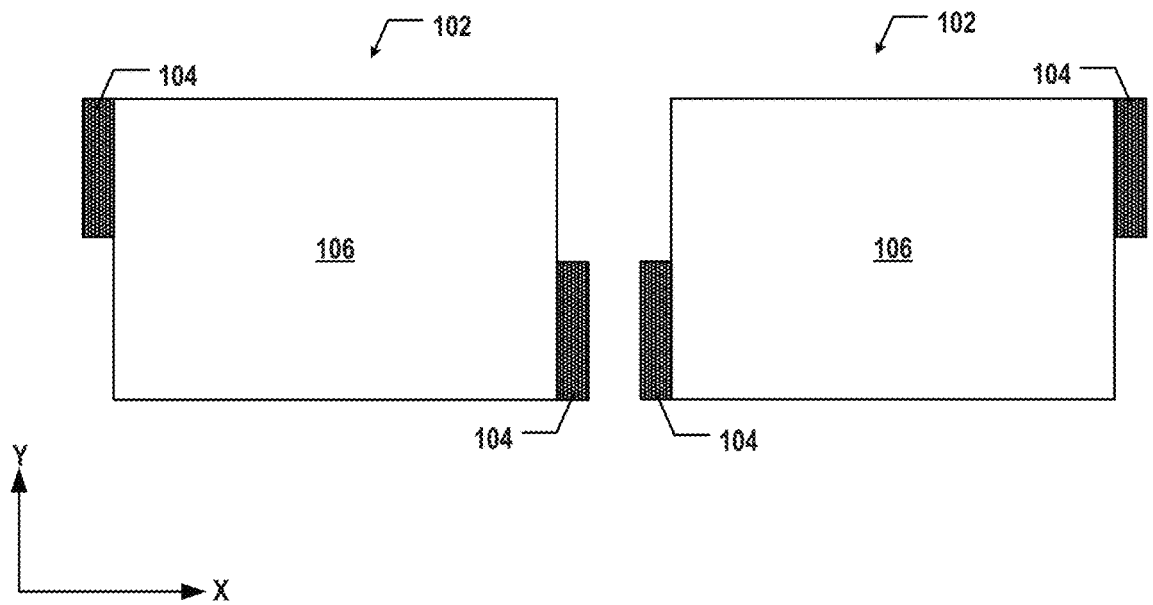
FIG. 1 illustrates a schematic diagram of a 3D memory device having staircase structures, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some 3D memory devices, such as 3D NAND memory devices, memory cells for storing data are vertically stacked through a stack structure (e.g., a memory stack) in vertical channel structures. 3D memory devices usually include staircase structures formed on one or more sides (edges) of the stacked storage structure for purposes such as word line fan-out. Dummy channel structures are usually formed through the memory stack in regions outside of the core array region in which the channel structures of 3D NAND memory devices are formed, such as staircase regions having the staircase structures, to provide mechanical support to the memory stack. When forming the memory stack, the conductive metal layers, such as tungsten (W) word lines, may introduce large stress to pull the channel structures and dummy channel structures extending therethrough.

Dummy channel structures are usually filled with silicon oxide, which has a relatively low hardness. Moreover, in known 3D NAND memory devices, each word line in the memory stack is a continuous layer extending in the core array region and the staircase region. As a result, the stress from the tungsten word lines can be propagated to the staircase region to pull the relatively soft (low stiffness) silicon oxide dummy channel structures in the staircase region, thereby causing a tilt of each dummy channel structure and channel structure, as well as the shift of the staircase structures. The tilt of each channel structure and the shift of staircase structures can further cause contact misalignment in the later process when making metal contacts, thereby reducing the production yield of the memory devices.

To address one or more of the aforementioned issues, the present disclosure introduces a solution that partially separates the word line between the core array region and the staircase region to reduce the stress propagation between the two regions. Consistent with the scope of the present disclosure, a cut structure can be formed between the staircase structure and the channel structures to cut off part of the word line that extends between the core array region and the staircase region. Electrical connections between the staircase structures and the channel structures can still be provided by the remainder of the word line, such as a through bridge structure that is not directly between the staircase structures and the channel structures. The cut structure can include the remainder of the dielectric stack that is not replaced during the gate-replacement process in forming the memory stack. In some implementations, parts of the stack sacrificial layers (e.g., silicon nitride layers) in the dielectric stack are not replaced by word lines (e.g., tungsten layers) during the gate-replacement process, such that the resulting word lines become discontinuous to release the stress from the word lines.

FIG. 1 illustrates a schematic diagram of a 3D memory device 100 having staircase structures 104, according to some aspects of the present disclosure. 3D memory device 100 can include multiple memory planes 102 each having a memory cell array in a memory array structure 106. It is noted that x and y axes are included in FIG. 1 to illustrate two orthogonal (perpendicular) directions in the wafer plane. The x-direction is the word line direction of 3D memory device 100, and the y-direction is the bit line direction of 3D memory device 100. 3D memory device 100 can also include two staircase structures 104 at opposite sides in the x-direction of each memory array structure 106. Each word line of memory plane 102 can extend laterally in the x-direction across the entire memory plane 102 to a respective stair (level) in staircase structure 104. In some implementations, 3D memory device 100 is a NAND Flash memory device in which memory cells are provided in the form of an array of NAND memory strings (not shown) in memory array structure 106. Memory array structure 106 can include any other suitable components including, but not limited to, gate line slits (GLSs), through array contacts (TACs), array common sources (ACSs), etc.

Figure 2:
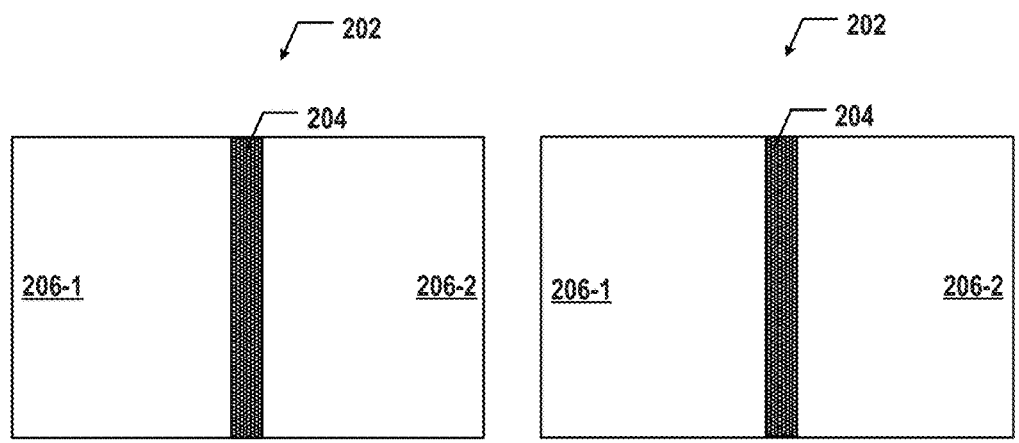
FIG. 2 illustrates a schematic diagram of another 3D memory device having staircase structures, according to some aspects of the present disclosure.

FIG. 2 illustrates a schematic diagram of a 3D memory device 200 having staircase structures 204, according to some aspects of the present disclosure. In some implementations, 3D memory device 200 includes multiple memory planes 202. Each memory plane 102 can include a memory array structure 206-1/206-2 and a staircase structure 204 in the intermediate of memory array structure 206-1/206-2 and laterally dividing memory array structure 206-1/206-2 into a first memory array structure 206-1 and a second memory array structure 206-2 in the x-direction (the word line direction). In some implementations, for each memory plane 202, staircase structure 204 is in the middle of memory array structure 206-1/206-2. That is, staircase structure 204 can be a center staircase structure, which equally divides memory array structure 206-1/206-2 into first and second memory array structures 206-1 and 206-2 with the same number of memory cells. For example, first and second memory array structures 206-1 and 206-2 may be symmetric in the x-direction with respect to center staircase structure 204. It is understood that in some examples, staircase structure 204 may be in the intermediate, but not in the middle (center), of memory array structure 206-1/206-2, such that first and second memory array structures 206-1 and 206-2 may have different sizes and/or numbers of memory cells. In some implementations, 3D memory device 200 is a NAND Flash memory device in which memory cells are provided in the form of an array of NAND memory strings (not shown) in first and second memory array structures 206-1 and 206-2. First and second memory array structures 206-1 and 206-2 can include any other suitable components including, but not limited to, GLSs, TACs, ACSs, etc. Each word line (not shown) of memory plane 202 extending laterally in the x-direction can be separated by staircase structure 204 into two parts: a first word line part across first memory array structure 206-1, and a second word line part across second memory array structure 206-2. As described below, the two parts of each word line can be electrically connected by a bridge structure (not shown) in staircase structure 204 at a respective stair in staircase structure 204.

Although in FIGS. 1 and 2, staircase structures 104 and 204 are functional staircase structures used for landing interconnects (e.g., word line contacts), it is understood that additional staircase structures (e.g., dummy staircase structures, not shown) may be formed at one or more sides as well for balancing load in etching or chemical mechanical polishing (CMP) processes during fabrication.

Figure 3:
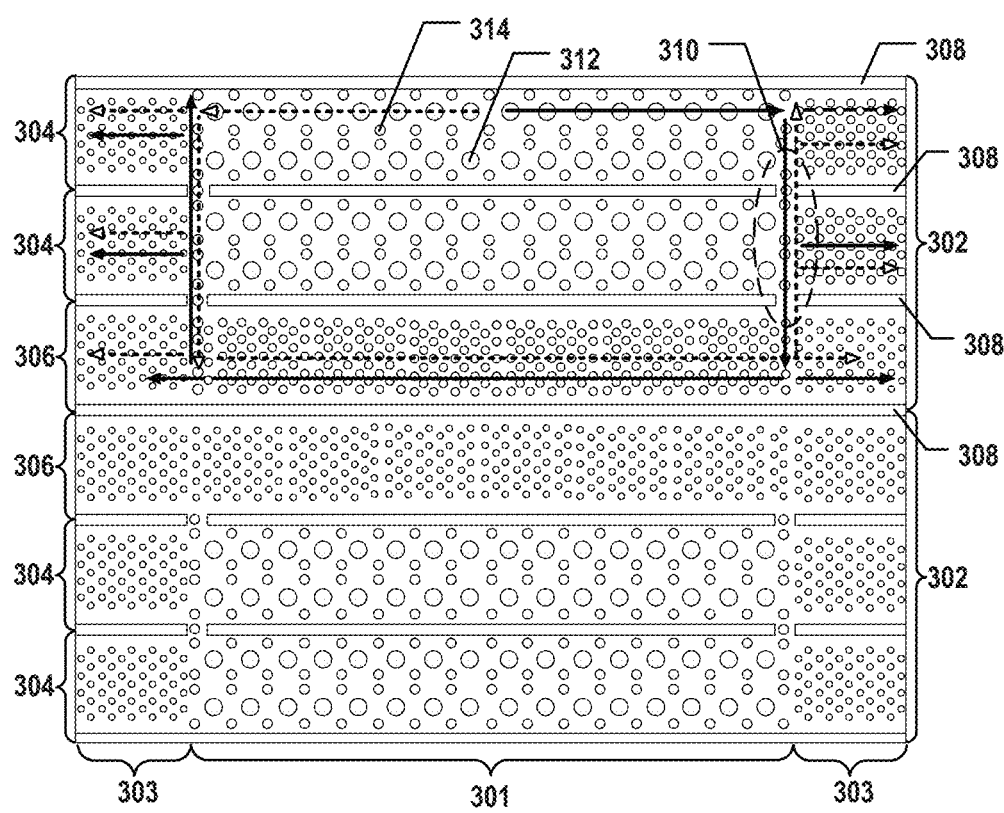
FIG. 3 illustrates a plan view of a 3D memory device having a staircase region, according to some aspects of the present disclosure.
Figure 3:
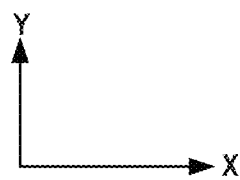

FIG. 3 illustrates a plan view of a 3D memory device 300 having a staircase region 301, according to some aspects of the present disclosure. 3D memory device 300 may be one example of part of memory plane 202 in FIG. 2 that includes staircase structure 204, and staircase region 301 of 3D memory device 300 may be one example of a region in which staircase structure 204 is formed in memory plane 202. As shown in FIG. 3, 3D memory device 300 can include multiple blocks 302 in the y-direction (the bit line direction) separated by parallel GLSs 308. In some implementations in which 3D memory device 300 is a NAND Flash memory device, each block 302 is the smallest erasable unit of the NAND Flash memory device. Each block 302 can further include multiple fingers 304 in the y-direction separated by some of GLSs 308 with "H" cuts 310.

In some implementations, staircase region 301 is in the intermediate (e.g., the middle) of 3D memory device 300 in the x-direction (the word line direction). In some implementations, FIG. 3 also shows a pair of core array regions 303 of the memory array structure in which an array of channel structures can be formed. It is understood that FIG. 3 only illustrates portions of core array regions 303 that are adjacent to staircase region 301. Core array regions 303 can include top select gates (TSGs, not shown), which can be individually driven or electrically connected by interconnects over staircase region 301, and the portions of core array regions 303 shown in FIG. 3 can be used to form the TSGs. As described below in detail, staircase region 301 can include multiple staircase zones each corresponding to a respective finger 304, and can include multiple bridge structures 306 each between two adjacent staircase zones in the y-direction. Each staircase zone can be in one or two blocks 302. 3D memory device 300 can include a plurality of dummy channel structures 314 in the staircase zones and bridge structures 306 to provide mechanical support and/or load balancing. 3D memory device 300 can further include word line contacts 312 in the staircase zones of staircase region 301 to be each landed on a respective word line (not shown) at each stair in staircase region 301 for word line driving.

Each bridge structure 306 connects (both physically and electrically) the first memory array structure and the second memory array structure (not shown), according to some implementations. That is, the staircase structures in staircase region 301 do not completely cut off the memory array structure in the intermediate, but instead leave the first and second memory array structures connected by bridge structures 306 thereof, according to some implementations. Each word line thus can be bilaterally driven (in both positive and negative x-directions) from a respective word line contact 312 in the staircase zones of staircase region 301 in the intermediate of 3D memory device 300 through bridge structures 306. For example, FIG. 3 further illustrates exemplary current paths of a bilateral word line-driving scheme with bridge structures 306. A first current path indicated by the solid arrows and a second current path indicated by the hollow arrows represent currents passing through two separate word lines at different levels, respectively.

Figure 4:
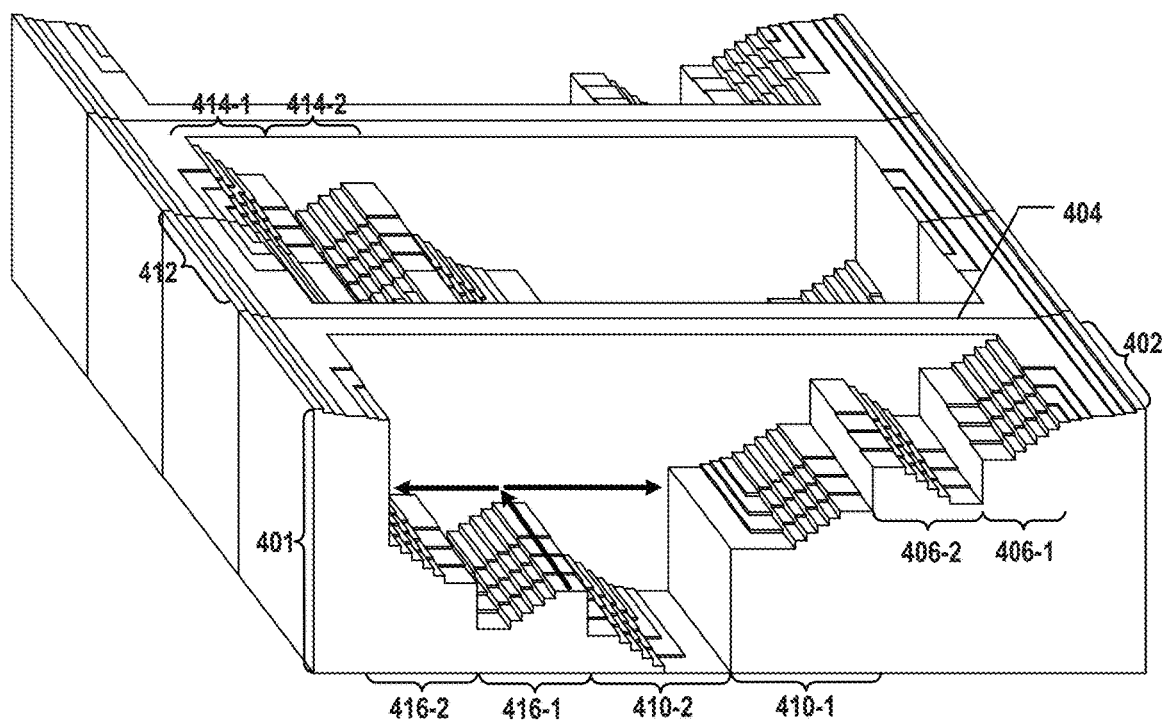
FIG. 4 illustrates a top front perspective view of a staircase region of a 3D memory device, according to some aspects of the present disclosure.
Figure 4:
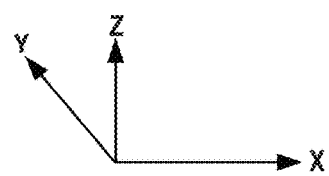

FIG. 4 illustrates a top front perspective view of a staircase region 400 of a 3D memory device, according to some aspects of the present disclosure. Staircase region 400 may be one example of staircase region 301 of 3D memory device 300 in FIG. 3. In staircase region 400, a stack structure 401 can be formed on a substrate (not shown), which can include silicon (e.g., single crystalline silicon), silicon germanium (SiGe), gallium arsenide (GaAs), germanium (Ge), silicon on insulator (SOI), or any other suitable materials.

It is noted that x, y, and z axes are included in FIG. 4 to further illustrate the spatial relationship of the components in stack structure 401. The substrate of the 3D memory device includes two lateral surfaces extending laterally in the x-y plane: a top surface on the front side of the wafer on which stack structure 401 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane) when the substrate is positioned in the lowest plane of the 3D memory device in the z-direction. The same notion for describing the spatial relationship is applied throughout the present disclosure.

Stack structure 401 can include vertically interleaved first material layers and second material layers that are different from the first material layers. The first material layers and second material layers can alternate in the vertical direction. In some implementations, stack structure 401 can include a plurality of material layer pairs stacked vertically in the z-direction, each of which includes a first material layer and a second material layer. The number of the material layer pairs in stack structure 401 can determine the number of memory cells in the 3D memory device.

In some implementations, the 3D memory device is a NAND Flash memory device, and stack structure 401 is a stacked storage structure through which NAND memory strings are formed. Each of the first material layers includes a conductive layer, and each of the second material layers includes a dielectric layer. That is, stack structure 401 can include interleaved conductive layers and dielectric layers (not shown). In some implementations, each conductive layer can function as a gate line of the NAND memory strings and a word line extending laterally from the gate line and ending at staircase structures 406, 410, and 416 for word line fan-out. The conductive layers can include conductive materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, or any combination thereof. In some implementations, the conductive layers include metals, such as tungsten, and the dielectric layers include silicon oxide.

Each stair (as shown as a "level") of staircase structures 406, 410, and 416 can include one or more material layer pairs. In some implementations, the top material layer of each stair is a conductive layer for interconnection in the vertical direction. In some implementations, every two adjacent stairs of staircase structures 406, 410, and 416 are offset by a nominally same distance in the z-direction and a nominally same distance in the x-direction. Each offset thus can form a "landing area" for interconnection with word line contacts (e.g., 312 in FIG. 3, not shown in FIG. 4) of the 3D memory device in the z-direction direction.

As shown in FIG. 4, staircase region 400 can include a first staircase zone 402, a second staircase zone 412, and a bridge structure 404 between first staircase zone 402 and second staircase zone 412 in the y-direction (the bit line direction). In some implementations, first staircase zone 402 includes a plurality pairs of staircase structures including a first pair of staircase structures 406-1 and 406-2, a second pair of staircase structures 410-1 and 410-2, and a third pair of staircase structures 416-1 and 416-2 in the x-direction (the word line direction). Each staircase structure 406-1, 406-2, 410-1, 410-2, 416-1, or 416-2 includes a plurality of stairs in the x-direction, according to some implementations.

In some implementations, each staircase structure 406-1, 406-2, 410-1, 410-2, 416-1, or 416-2 is a functional staircase structure used for landing interconnects (e.g., word line via contacts), as opposed to a dummy staircase structure. In other words, none of staircase structures 406-1, 406-2, 410-1, 410-2, 416-1, and 416-2 in first staircase zone 402 is a dummy staircase, according to some implementations.

Although first staircase zone 402 is described above in detail, it is understood that the scheme of arranging staircase structures in first staircase zone 402 disclosed herein may be similarly applied to second staircase zone 412 or any other staircase zones in staircase region 400. For example, second staircase zone 412 may include a pair of staircase structures 414-1 and 414-2 facing each other in the x-direction and at different depths, like first staircase zone 402.

Bridge structure 404 can include vertically interleaved conductive layers and dielectric layers (not shown), and the conductive layers (e.g., metal layers or polysilicon layers) can function as part of word lines. Different from at least some staircases in first and staircase zones 402 and 412 in which the word lines therein are cut off from the memory array structure in the x-direction (e.g., in the positive x-direction, the negative x-direction, or both), the word lines in bridge structure 404 can be preserved to bridge the word line contacts landed on staircase structures 406, 410, and 416 and the memory array structures in order to achieve the bilateral word line-driving scheme. In some implementations, at least one stair in a staircase structure in first or second staircase zone 402 or 412 is electrically connected to at least one of the first memory array structure and the second memory array structure through bridge structure 404. At least one word line can extend laterally in the memory array structure and bridge structure 404, such that the at least one stair can be electrically connected to the at least one of the first and second memory array structures through bridge structure 404 by the at least one word line. In one example, a stair in staircase structure 406-1 may be electrically connected to the first memory array structure (in the negative x-direction) by a respective word line part extending in the negative x-direction through bridge structure 404. Bridge structure 404, however, may not be needed to electrically connect the same stair to the second memory array structure (in the positive x-direction) because the respective word line part extending in the positive x-direction is not cut off. In another example, a stair in staircase structure 416-2 may be electrically connected to the second memory array structure (in the positive x-direction) by a respective word line part extending in the positive x-direction through bridge structure 404. Bridge structure 404, however, may not be needed to electrically connect the same stair to the first memory array structure (in the negative x-direction) because the respective word line part extending in the negative x-direction is not cut off.

In some implementations, the at least one stair in staircase structures 406, 410, 414, and 416 in first and second staircase zones 402 and 412 is electrically connected to each of the first memory array structure and the second memory array structure through bridge structure 404. For example, as shown in FIG. 4, a stair in staircase structure 416-1 may be electrically connected to both the first and second memory array structures through bridge structure 404 by the respective word line parts extending in the negative and positive x-directions, respectively, as indicated by the current paths (represented by the arrows).

Figure 5A:
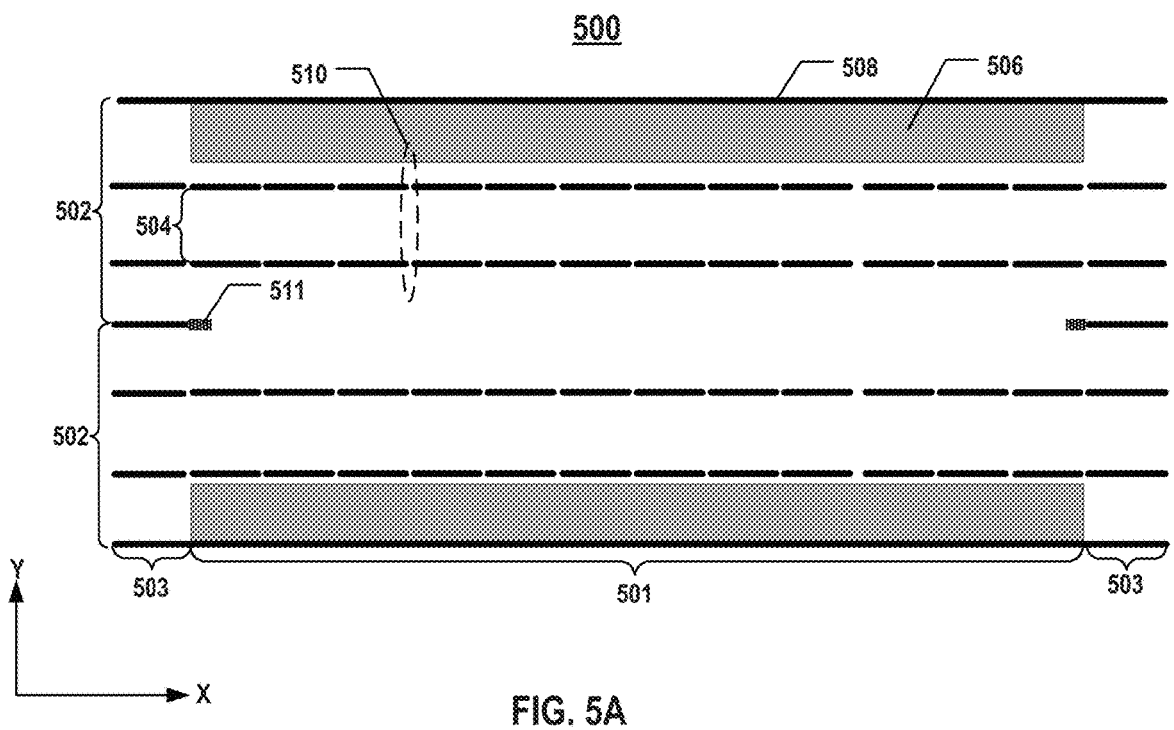
FIGS. 5A and 5B illustrate a plan view, a perspective view, and a side view of a 3D memory device having a staircase structure.
Figure 5B:
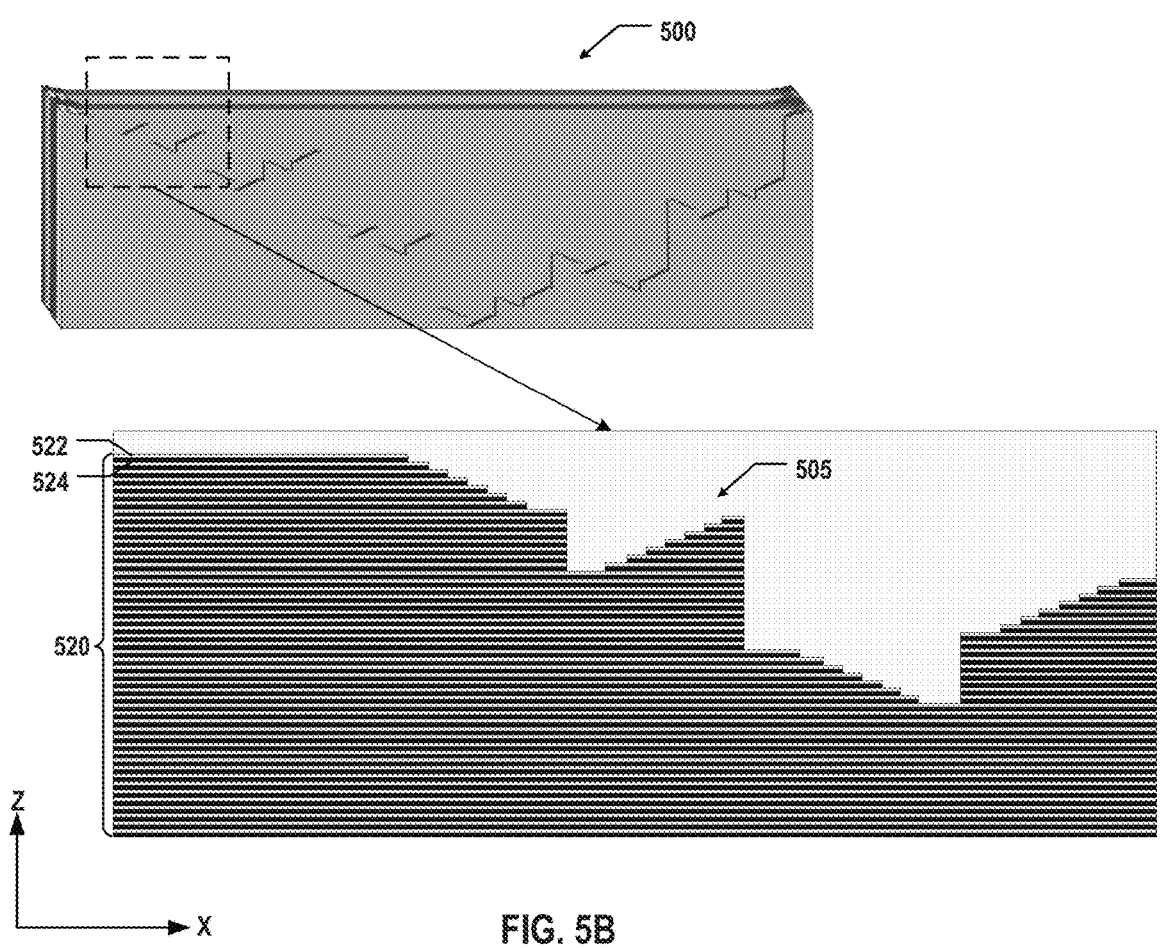

FIGS. 5A and 5B illustrate a plan view, a perspective view, and a side view of a 3D memory device 500 having a staircase structure. 3D memory device 500 is one example of 3D memory device 200 in FIG. 2. 3D memory device 500 includes a memory stack 520 having interleaved conductive layers (word lines) 524 and dielectric layers 522, as shown in FIG. 5B. 3D memory device 500 includes a plurality of staircase structures 505 in a staircase region 501 and an array of channel structures (not shown) in two core array regions 503, as shown in the plan view of FIG. 5A. As described above, staircase region 501 is between two core array regions 503 in the x-direction (the word line direction). Similar to FIG. 3, it is understood that FIG. 5A only illustrates portions of core array regions 503 that are adjacent to staircase region 501. Core array regions 503 can include TSGs (not shown in FIG. 5A) in the portions that are adjacent to staircase region 501 as shown in FIG. 5A. In the y-direction (the bit line direction), 3D memory device 500 includes multiple blocks 502 separated by parallel GLSs 508. Each block 502 further includes multiple fingers 504 in the y-direction separated by some of GLSs 508 with "H" cuts 510. Dummy channel structures 511 are formed in staircase region 501 and is filled with silicon oxide. Bridge structures 506 are also formed in staircase region 501.

Word line 524 is a continuous conductive layer extending in two core array regions 503 and staircase region 501 in the x-direction (the word line direction). The high stress of the tungsten material forming word lines 524 in core array regions 503 can thus propagate along the x-direction to staircase region 501 through continuous word line 524. The relatively soft silicon oxide material filling dummy channel structures 511 in staircase region 501 may not provide enough support to balance the stress and thus, may cause a large shift of staircase structures 505 and the word line contacts thereon (not shown) in staircase region 501, as well as the collapse of memory stack 520 in staircase region 501.

Figure 6A:
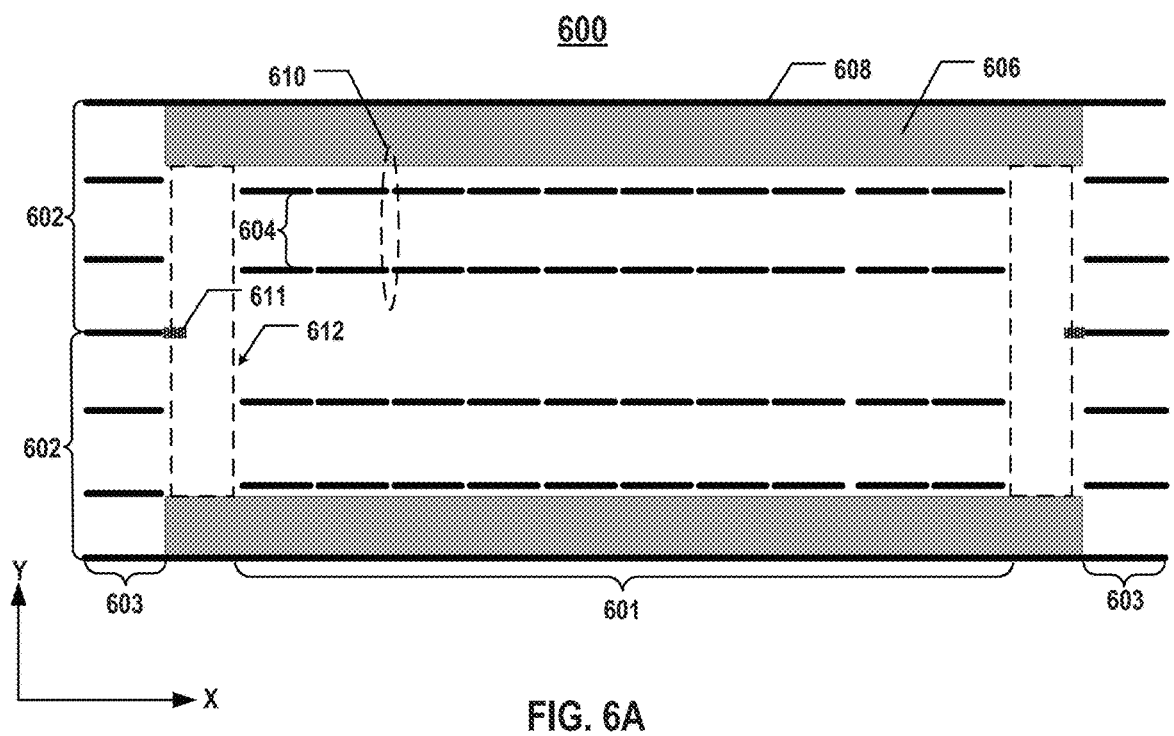
FIGS. 6A and 6B illustrate a plan view, a perspective view, and a side view of a 3D memory device having a staircase structure, according to some aspects of the present disclosure.
Figure 6B:
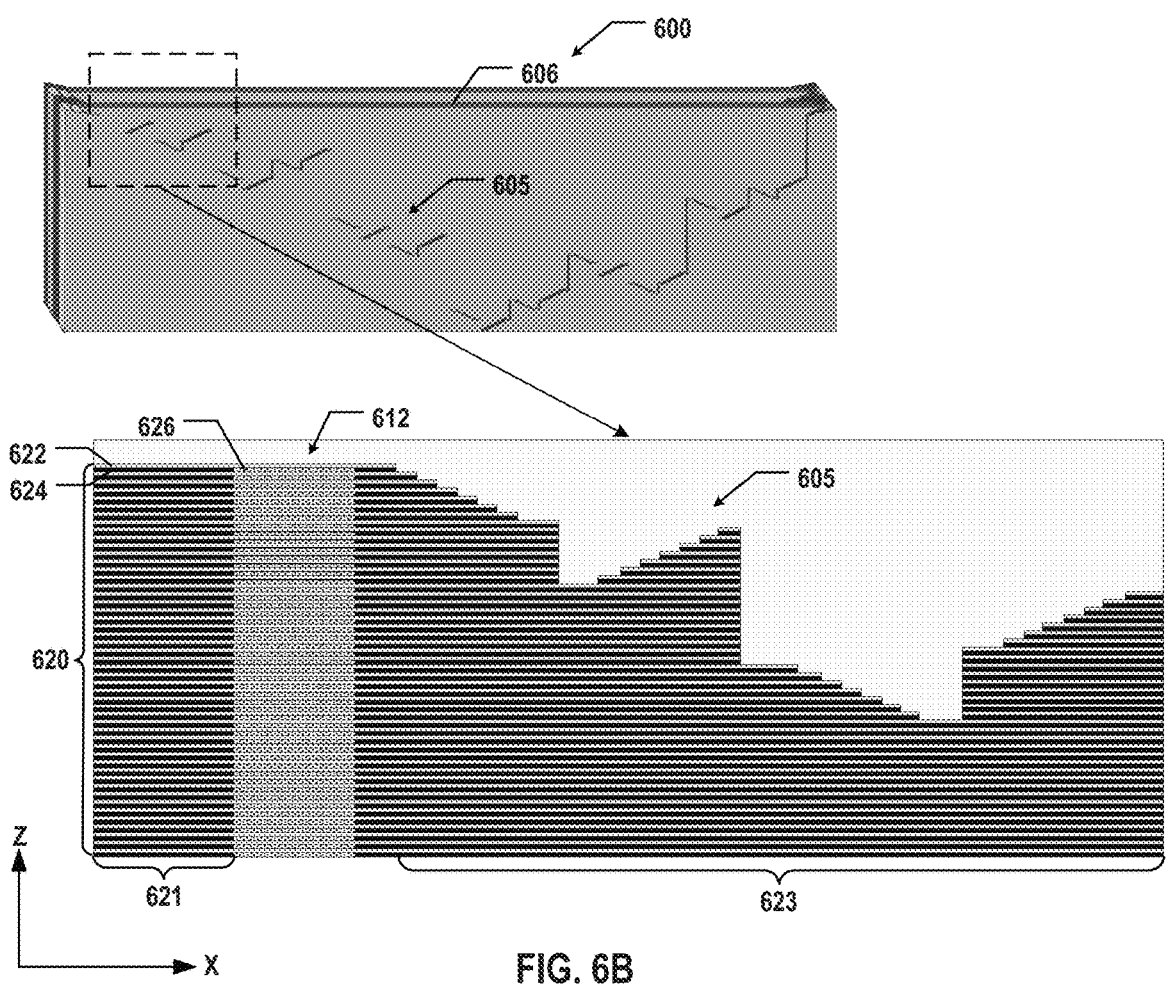

In contrast, as shown in FIGS. 6A, 6B, 7A, 7B, 8, 9, 10A, 10B, 11A, and 11B below in detail, by partially separating word lines between the channel structures and staircase structures, each word line can become discontinuous in the word line direction between the staircase region and the core array region. As a result, the stress from the core array region can no longer propagate through the word lines in the word line direction to the staircase region to cause the shift of the staircase structures and word line contacts in the staircase region. For example, FIGS. 6A and 6B illustrate a plan view, a perspective view, and a side view of a 3D memory device 600 having a staircase region, according to some aspects of the present disclosure. 3D memory device 600 may be one example of 3D memory devices 200 and 300 in FIGS. 2 and 3.

3D memory device 600 can include a plurality of staircase structures 605 in a staircase region 601 and a plurality of channel structures (not shown in FIGS. 6A and 6B, e.g., channel structures 1210 in FIGS. 12A-12D) in two core array regions 603. As shown in the plan view of FIG. 6A, staircase region 601 and two core array regions 603 are arranged along the x-direction (the word line direction), and staircase region 601 is between two core array regions 603, according to some implementations. Similar to FIG. 3, it is understood that FIG. 6A only illustrates portions of core array regions 603 that are adjacent to staircase region 601. Core array regions 603 can include TSGs (not shown in FIG. 6A) in the portions that are adjacent to staircase region 601 as shown in FIG. 6A. For example, as shown in the perspective view of FIG. 6B, a set of stairs may be formed in the peripheral region for making interconnections of the TSGs. Nevertheless, a peripheral region is considered to be part of core array region 603 in the present disclosure. In the y-direction (the bit line direction), 3D memory device 600 can include a plurality of blocks 602 separated by parallel slit structures 608 (e.g., GLSs). 3D memory device 600 also includes slit structures 608 each extending along the x-direction in staircase region 601 and two core array regions 603, according to some implementations. That is, slit structure 608 can be a continuous structure extending from one core array region 603 through staircase region 601 to another core array region 603 along the x-direction. Each block 602 can further include a plurality of fingers 604 in the y-direction separated by some of slit structures 608 with "H" cuts 610.

As shown in FIG. 6A, 3D memory device 600 can further include a plurality of dummy channel structures 611 in staircase region 601. It is understood that only some dummy channel structures 611 are shown in FIG. 6A for illustrative purposes only, and the actual number and layout of dummy channel structures 611 may vary in different examples. Each dummy channel structure 611 can include, e.g., filled with, a dielectric material including, but not limited to, silicon oxide, silicon nitride, silicon oxynitride, high dielectric constant (high-k) dielectrics, or any combination thereof. In some implementations, dummy channel structure 611 includes silicon oxide. As shown in FIG. 6A, 3D memory device 600 can further include a plurality of bridge structures 606 in staircase region 601 as well. Bridge structures 606 and staircase structures 605 are disposed along the y-direction (the bit line direction) that is perpendicular to the x-direction (the word line direction), according to some implementations. Each bridge structure 606 can extend through and over staircase region 601 along the x-direction.

Different from 3D memory device 500 in FIGS. 5A and 5B, 3D memory device 600 can further include cut structures 612 each disposed between staircase structures 605 and the channel structures in a respective core array region 603. As shown in the plan view of FIG. 6A, each cut structure 612 is between staircase region 601 and a respective core array region 603 in the x-direction (the word line direction), according to some implementations. In some implementations, bridge structure 606 extends over staircase region 601, such that cut structure 612 contacts bridge structure 606 along the y-direction. In one example, as shown in FIG. 6A, both ends of cut structure 612 in the y-direction may contact two adjacent bridge structures 606, respectively. In some implementations, dummy channel structures 611 are disposed outside of staircase region 601, for example, overlapping cut structure 612 as shown in FIG. 6A. Thus, it is understood that cut structures 612 may be viewed as being disposed in regions extending from staircase region 601, compared with 3D memory device 500 in FIGS. 5A and 5B.

As shown in FIG. 6B, 3D memory device 600 can include a memory stack 620 including interleaved conductive layers (word lines) 624 and dielectric layers 622. Word line 624 can extend in staircase region 601 and two core array regions 603. For example, word line 624 may extend from one core array region 603 through staircase region 601 to another core array region 603. Different from continuous word line 524 of 3D memory device 500, due to the existence of cut structure 612, word line 624 of 3D memory device 600 is discontinuous in the x-direction (the word line direction) between staircase region 601 and core array region 603, according to some implementations. That is, in some implementations, cut structure 612 cuts off a part of word line 624 extending along the x-direction between staircase region 601 and core array region 603. As a result, each word line 624 is no longer a continuous layer in the word line direction, and the discontinuation on word line 624 between staircase region 601 and core array region 603 can release the stress prorogated through word line 624 between staircase region 601 and core array region 603, thereby reducing the chance of collapse of memory stack 620 and the shift of staircase structures 605.

On the other hand, since cut structure 612 does not extend through bridge structure 606, word line 624 can still extend between the channel structures in core array region 603 and staircase structure 605 in staircase region 601 through bridge structure 606, thereby still maintaining the electrical connection in core array region 603 and staircase region 601 through word line 624. That is, word line 624 may not be completely separated between core array region 603 and staircase region 601. Instead, only a portion of word line 624 that is between core array region 603 and staircase region 601 in the word line direction is cut off by cut structure 612 to form discontinuation on word line 624; the remainders of word line 624, e.g., on bridge structure 606, still remain to maintain the electrical path, according to some implementations. In some implementations, cut structure 612 contacts bridge structure 606 along the bit line direction, such that word line 624 only remains on bridge structure 606 between core array region 603 and staircase region 601.

In some implementations, cut structure 612 includes a dielectric portion including interleaved first dielectric layers 622 and second dielectric layers 626 different from first dielectric layers 622. That is, dielectric layers 622 of memory stack 620 remain as first dielectric layers 622 in the dielectric portion of cut structure 612, while conductive layers (word lines) 624 of memory stack 620 are replaced with second dielectric layers 626 in the dielectric portion of cut structure 612, according to some implementations. In some implementations, first dielectric layers 622 include silicon oxide, second dielectric layers 626 include silicon nitride, and conductive layers (word lines) 624 include a metal, such as tungsten. In other words, a portion of word line 624 extending along the x-direction between core array region 603 and staircase region 601 is replaced with second dielectric layer 626 of cut structure 612, according to some implementations. Due to the lower stiffness of the dielectric materials (e.g., silicon nitride) in second dielectric layer 626 compared with the metal material (e.g., tungsten) in word line 624, second dielectric layer 626 can serve as a buffer to release and/or absorb the stress prorogated through word line 624. As described below in detail with respect to the fabrication process, the dielectric portion of cut structure 612 can be formed by limiting the extension of some slit structures 608 (e.g., between bridge structures 606 in the y-direction) in the x-direction to control the scope and range of the gate-replacement process that forms word lines 624. In some implementations, as shown in FIG. 6A, each slit structure 608 between bridge structures 606 in the y-direction does not extend into cut structure 612.

Cut structures 612 can also divide memory stack 620 into multiple stack structures. As shown in FIG. 6B, memory stack 620 of 3D memory device 600 includes a first stack structure 621 in which the channel structures are formed, according to some implementations. First stack structure 621 can include interleaved conductive layers 624 and dielectric layers 622, and each channel structure can extend vertically through first stack structure 621. As shown in FIG. 6B, memory stack 620 of 3D memory device 600 also includes a second stack structure 623 in which staircase structures 605 are formed, according to some implementations. Second stack structure 623 can also include interleaved conductive layers 624 and dielectric layers 622. In some implementations, the edges of interleaved conductive layers 624 and dielectric layers 622 of second stack structure 623 define the stairs of each staircase structure 605. In some implementations, dummy channel structures 611 extend vertically through second stack structure 623. As shown in FIG. 6B, memory stack 620 of 3D memory device 600 further includes cut structure 612 between first stack structure 621 and second stack structure 623, such that conductive layers 624 of first stack structure 621 are partially separated from conductive layers 624 of second stack structure 623 by cut structure 612, according to some implementations. In some implementations, dielectric layers 622 of first and second stack structures 621 and 623 and dielectric layers 622 of cut structure 612 are the same continuous layers and have the same dielectric material, such as silicon oxide. In some implementations, bridge structure 606 also includes interleaved conductive layers 624 and dielectric layers 622, such that conductive layers 624 of second stack structure 623 are connected (both physically and electrically) to conductive layers 624 of first stack structure 621 through conductive layers 624 of bridge structure 606.

It is understood that memory stack 620 may include first stack structure 621 and cut structure 612 in FIG. 6B, respectively, in FIG. 6A, and memory stack 620 may further include a third stack structure and another cut structure (not shown in FIG. 6B) that are similar to first stack structure 621 and cut structure 612 in FIG. 6B and are arranged symmetrically to first stack structure 621 and cut structure 612 with respect to second stack structure 623 (i.e., the other cut structure between the third stack structure and second stack structure 623, and second stack structure 623 between first stack structure 621 and the third stack structure), such that conductive layers 624 of the third stack structure may also be partially separated from conductive layers 624 of second stack structure 623 by the other cut structure.

Figure 7A:
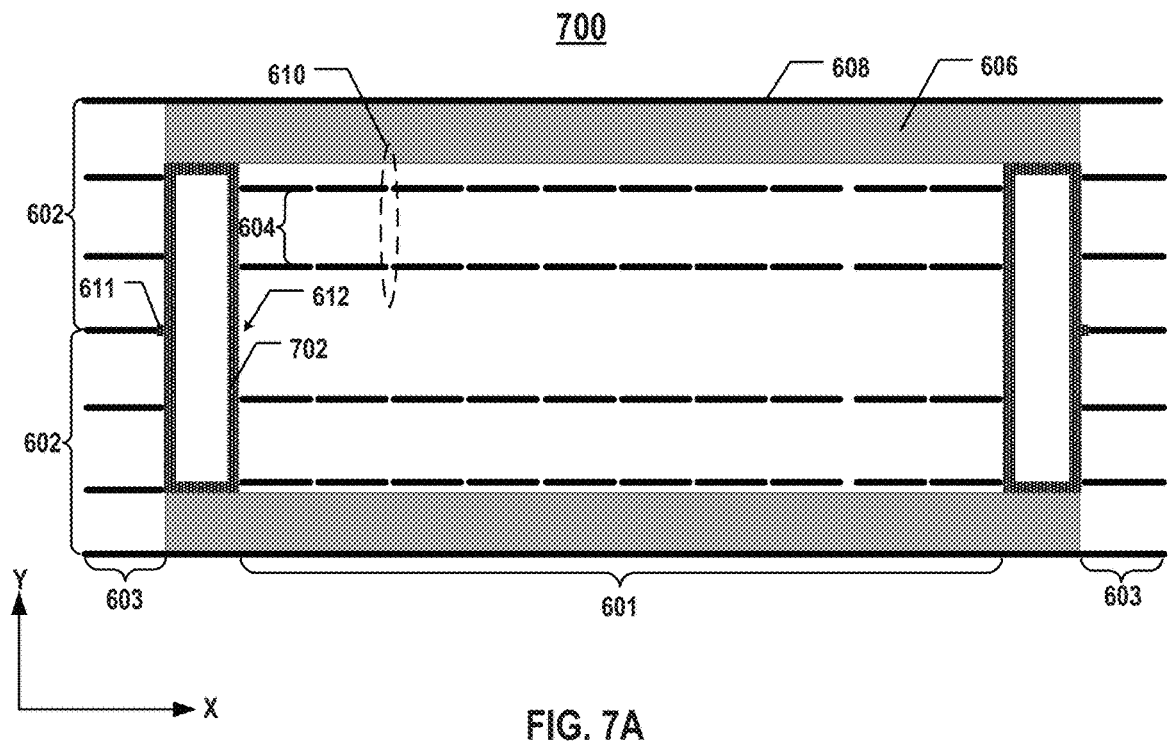
FIGS. 7A and 7B illustrate a plan view, a perspective view, and a side view of another 3D memory device having a staircase structure, according to some aspects of the present disclosure.
Figure 7B:
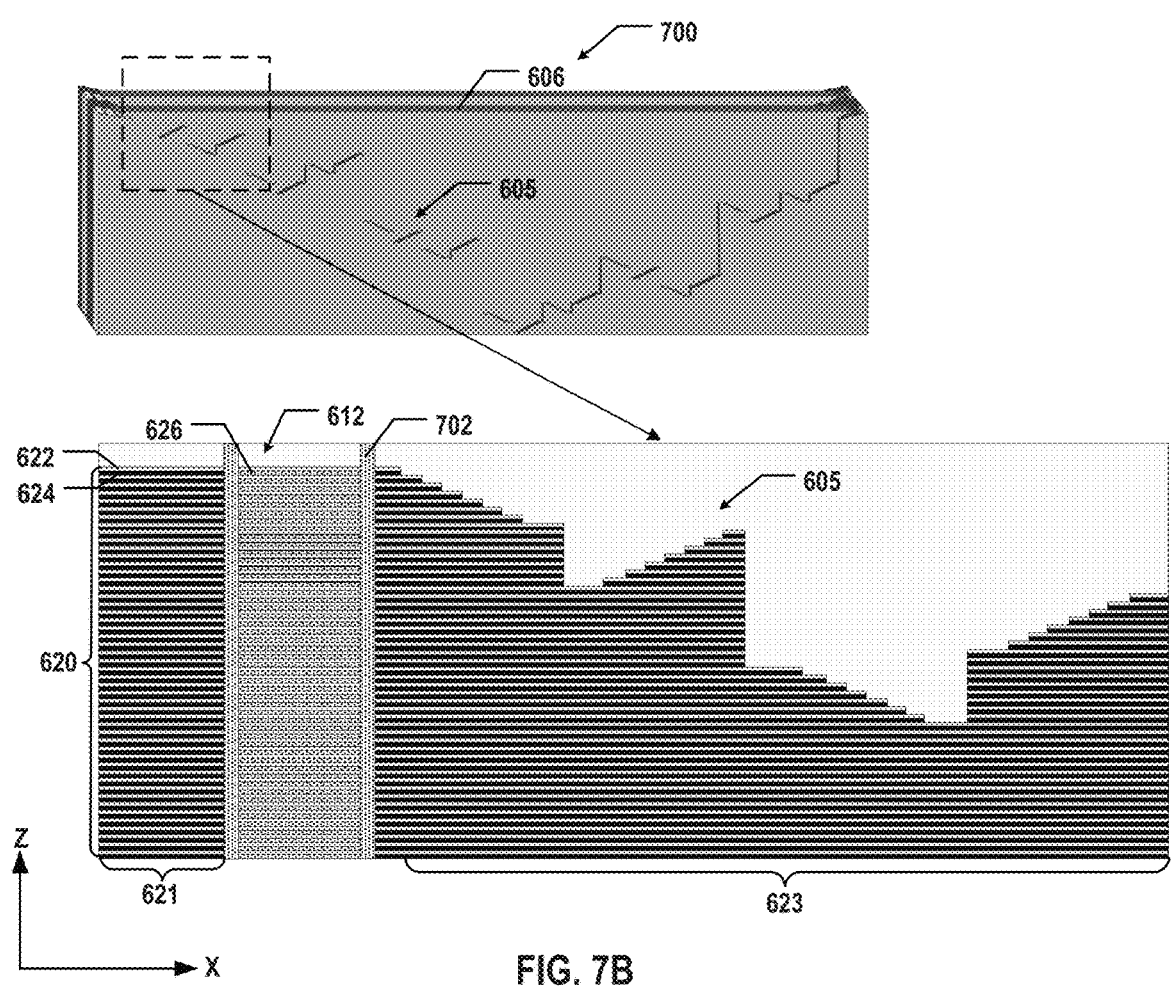

The designs of cut structures 612 are not limited to the example in 3D memory device 600 and may vary in other 3D memory devices. For example, FIGS. 7A and 7B illustrate a plan view, a perspective view, and a side view of another 3D memory device 700 having a staircase structure, according to some aspects of the present disclosure. 3D memory device 700 may be another example of 3D memory devices 200 and 300 in FIGS. 2 and 3. 3D memory device 700 may be similar to 3D memory device 600 except for the design of cut structure 612. Thus, the same structures between 3D memory device 600 and 3D memory device 700 are not repeated for ease of descriptions.

As shown in FIGS. 7A and 7B, the dielectric portion of cut structure 612 of 3D memory device 700 can further include a dielectric trench 702 circumscribing interleaved first and second dielectric layers 622 and 626. That is, dielectric trench 702 can surround and in contact with interleaved first and second dielectric layers 622 and 626. As shown in FIG. 7B, dielectric trench 702 can also extend vertically (in the z-direction) through memory stack 620 to surround and in contact with each dielectric layer 622 or 626. Dielectric trench 702 can include, e.g., filled with, a dielectric material including, but not limited to, silicon oxide, silicon nitride, silicon oxynitride, high-k dielectrics, or any combination thereof. In some implementations, dielectric trench 702 and dummy channel structures 611 have the same dielectric material, such as silicon oxide. As described below in detail with respect to the fabrication process, dielectric trench 702 and dummy channel structures 611 may be formed by the same process and thus, have the same dielectric material.

It is understood that in some examples, at least one of the two sides of dielectric trench 702 in the x-direction may contact adjacent bridge structures 606, such that the two sides of dielectric trench 702 in the y-direction may not be needed. That is, the number of sides of dielectric trench 702 may vary in different examples. It is also understood that the shape of dielectric trench 702 is not limited to the rectangle in FIG. 7A and may be any other suitable shapes in other examples.

Figure 8:
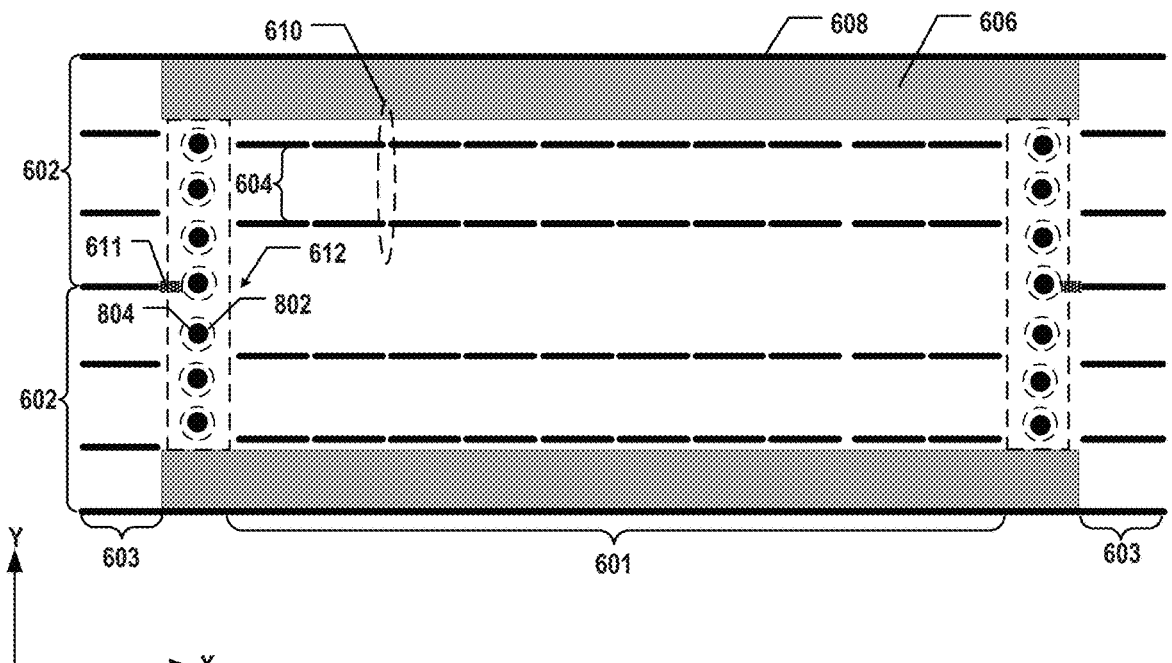
FIG. 8 illustrates a plan view of still another 3D memory device having a staircase structure, according to some aspects of the present disclosure.
Figure 9:
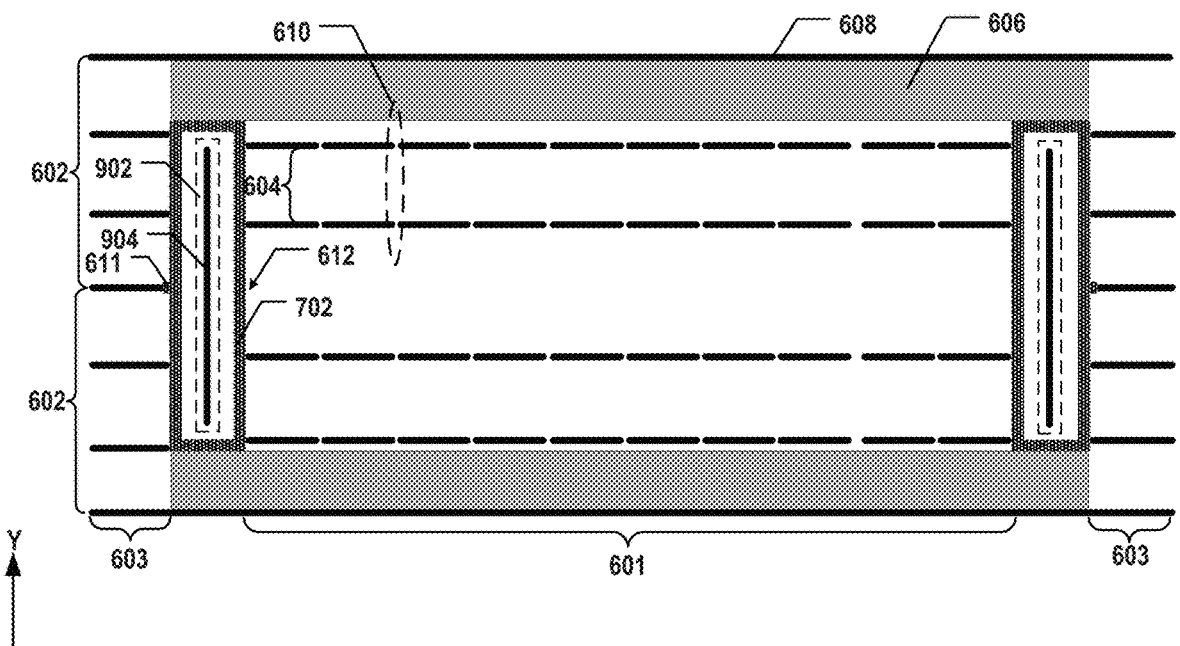
FIG. 9 illustrates a plan view of yet another 3D memory device having a staircase structure, according to some aspects of the present disclosure.

Besides the dielectric portion, cut structure 612 may include a conductive portion as well in some examples to adjust the stress propagating through cut structure 612. The conductive portion may be filled with conductive materials having a different stiffness than the dielectric portion, such that the stress release function of cut structure 612 can be further tuned by the design of the dielectric portion and the conductive portion depending on the various needs in different memory devices. For example, FIG. 8 illustrates a plan view of still another 3D memory device 800 having a staircase structure, according to some aspects of the present disclosure, and FIG. 9 illustrates a plan view of yet another 3D memory device 900 having a staircase structure, according to some aspects of the present disclosure. 3D memory devices 800 and 900 may be additional examples of 3D memory devices 200 and 300 in FIGS. 2 and 3. 3D memory devices 800 and 900 may be similar to 3D memory device 600 except for the design of cut structure 612. Thus, the same structures between 3D memory device 600 and 3D memory devices 800 and 900 are not repeated for ease of description.

As shown in FIG. 8, besides the dielectric portion, cut structure 612 of 3D memory device 800 can also include a conductive portion 802 circumscribed by interleaved first and second dielectric layers 622 and 626 (e.g., as shown in FIG. 6B). In some implementations, conductive portion 802 includes interleaved conductive layers 624 and dielectric layers 622. That is, conductive portion 802 can have the same materials as first stack structure 621 of memory stack 620. In some implementations, conductive portion 802 and word lines 624 include the same conductive material, such as a metal (e.g., tungsten). As described below in detail with respect to the fabrication process, conductive layers 624 of conductive portion 802 and word lines 624 may be formed by the same gate-replacement process and thus, have the same conductive material. As shown in FIG. 8, cut structure 612 can further include a pseudo-slit structure 804 that is circumscribed by conductive portion 802. Just like slit structure 608 for forming word lines 624 during the gate-replacement process, pseudo-slit structure 804 can be used for forming conductive portion 802 during the gate-replacement process. In some implementations, slit structure 608 and pseudo-slit structure 804 have the same materials. In one example, slit structure 608 and pseudo-slit structure 804 may have conductive materials, such as tungsten and polysilicon. In another example, slit structure 608 and pseudo-slit structure 804 may have dielectric materials, such as silicon oxide. Nevertheless, conductive portion 802 of cut structure 612 is spaced apart from word lines 624 outside of cut structure 612 (e.g., being circumscribed by the dielectric portion) to maintain the discontinuation on word line 624 in the x-direction between core array region 603 and staircase region 601, according to some implementations.

As shown in FIG. 8, in some implementations, cut structure 612 includes a plurality of conductive portions 802 each in a circular ring shape. It is understood that the design (e.g., the number, shape, and/or the layout) of the conductive portion of cut structure 612 is not limited to the example in FIG. 8 and may vary in other examples. For example, as shown in FIG. 9, cut structure 612 of 3D memory device 900 may include a single conductive portion 902 in a rectangular ring shape circumscribed by interleaved first and second dielectric layers 622 and 626. Cut structure 612 may further include a pseudo-slit structure 904 that is circumscribed by conductive portion 902. It is also understood that dielectric trench 702 may be combined with the conductive portion(s) in the design of cut structure 612 to further increase the flexibility of the stress release function of cut structure 612. For example, as shown in FIG. 9, cut structure 612 may include dielectric trench 702 surrounding conductive portion 902 as well.

Figure 10A:
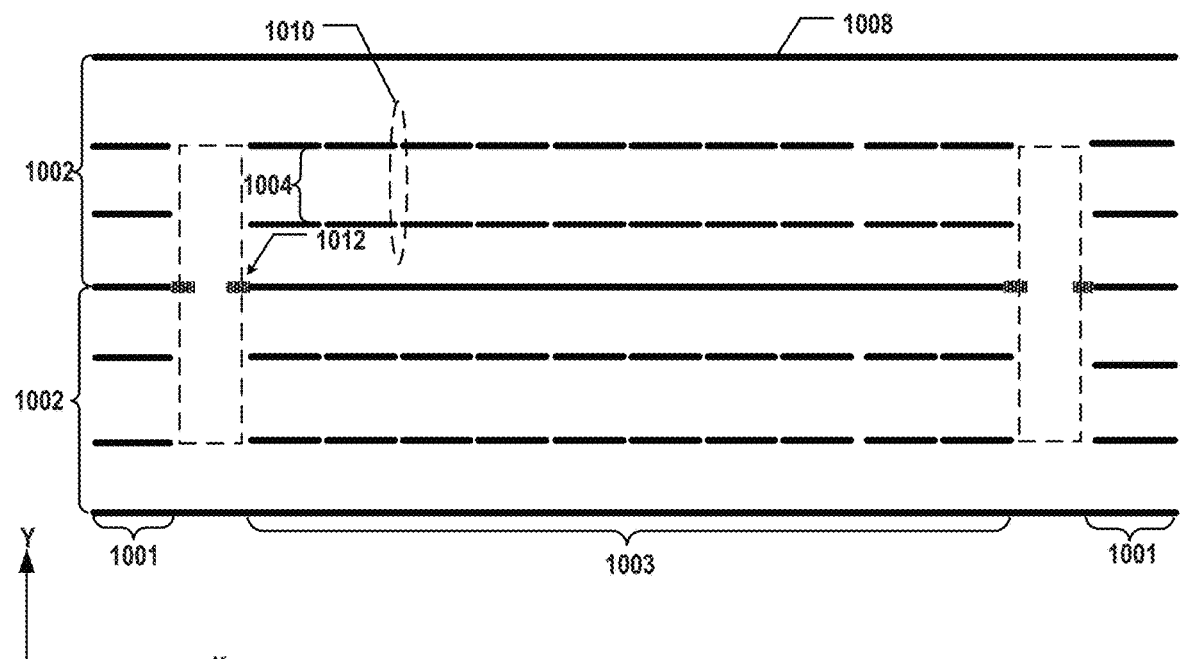
FIGS. 10A and 10B illustrate a plan view and a side view of yet another 3D memory device having a staircase structure, according to some aspects of the present disclosure.
Figure 10B:
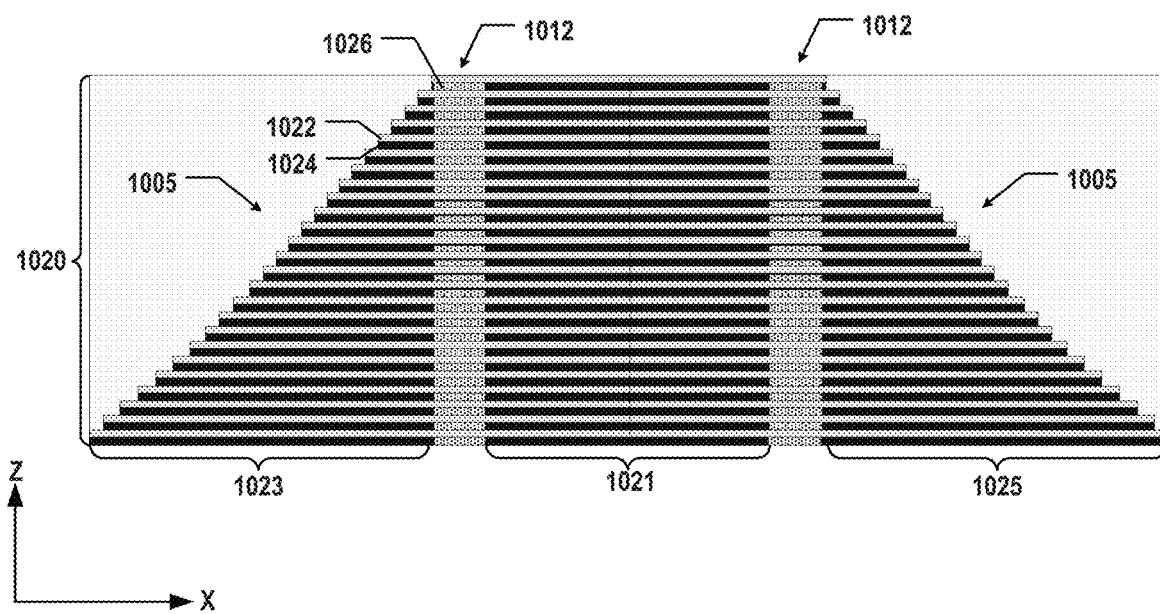

Cut structures 612 are described above with respect to 3D memory devices 600, 700, 800, and 900 that have staircase region 601 between two core array regions 603, e.g., examples of 3D memory device 200 in FIG. 2. It is understood that the idea of partially separating the word lines between the core array region and staircase region using a cut structure for stress releasing may be similarly applied to 3D memory device 100 in FIG. 1, in which a core array region is between staircase regions. For example, FIGS. 10A and 10B illustrate a plan view and a side view of yet another 3D memory device 1000 having a staircase structure, according to some aspects of the present disclosure. 3D memory device 1000 may be an example of 3D memory device 100 in FIG. 1. The similar structures between 3D memory device 600 and 3D memory device 1000 may not be repeated in detail for ease of description.

3D memory device 1000 can include a plurality of staircase structures 1005 in staircase regions 1001 and a plurality of channel structures (not shown in FIGS. 10A and 10B, e.g., channel structures 1210 in FIGS. 12A-12D) in a core array region 1003. As shown in the plan view of FIG. 10A, two staircase regions 1001 and core array region 1003 are arranged along the x-direction (the word line direction), and core array region 1003 is between two staircase regions 1001, according to some implementations. In the y-direction (the bit line direction), 3D memory device 1000 can include a plurality of blocks 1002 separated by parallel slit structures 1008 (e.g., GLSs). 3D memory device 1000 also includes slit structures 1008 each extending along the x-direction in two staircase regions 1001 and core array regions 1003, according to some implementations. Each block 1002 can further include a plurality of fingers 1004 in the y-direction separated by some of slit structures 1008 with "H" cuts 1010.

As shown in FIG. 10A, 3D memory device 1000 can further include a plurality of dummy channel structures (e.g., dummy channel structures 1214 in the side view of FIGS. 12C and 12D) in staircase regions 1001. Different from 3D memory devices 600, 700, 800, and 900, 3D memory device 1000 may not include bridge structures in staircase regions 1001 since core array region 1003 is not separated by staircase structures 1005.

Different from 3D memory device 500 but similar to 3D memory devices 600, 700, 800, and 900, 3D memory device 1000 can further include cut structures 1012 each disposed between a respective staircase structure 1005 and the channel structures in core array region 1003. As shown in the plan view of FIG. 10A, each cut structure 1012 is between a respective staircase region 1001 and core array region 1003 in the x-direction (the word line direction), according to some implementations. In some implementations, cut structure 1012 is spaced apart from slit structure 1008 along the y-direction (the bit line direction). In one example, as shown in FIG. 10A, both ends of cut structure 1012 in the y-direction may be spaced apart from two adjacent slit structures 1008, respectively.

As shown in FIG. 10B, 3D memory device 1000 can include a memory stack 1020 including interleaved conductive layers (word lines) 1024 and dielectric layers 1022. Word line 1024 can extend in two staircase regions 1001 and core array region 1003. For example, word line 1024 may extend from one staircase region 1001 through core array region 1003 to another staircase region 1001. Different from continuous word line 524 of 3D memory device 500, due to the existence of cut structure 1012, word line 1024 of 3D memory device 1000 is discontinuous in the x-direction (the word line direction) between staircase region 1001 and core array region 1003, according to some implementations. That is, in some implementations, cut structure 1012 cuts off a part of word line 1024 extending along the x-direction between staircase region 1001 and core array region 1003. As a result, each word line 1024 is no longer a continuous layer in the word line direction, and the discontinuation on word line 1024 between staircase region 1001 and core array region 1-03 can release the stress prorogated through word line 1024 between staircase region 1001 and core array region 1003, thereby reducing the chance of collapse of memory stack 1020 and the shift of staircase structures 1005.

On the other hand, since cut structure 1012 is spaced apart from slit structure 1008 in the bit line direction, word line 1024 can still extend between the channel structures in core array region 1003 and staircase structure 1005 in staircase region 1001 through the space between cut structure 1012 and slit structure 1008 in the bit line direction, thereby still maintaining the electrical connection in core array region 1003 and staircase region 1001 through word line 1024. That is, word line 1024 may not be completely separated between core array region 1003 and staircase region 1001. Instead, only a portion of word line 1024 that is between core array region 1003 and staircase region 1001 in the word line direction is cut off by cut structure 1012 to form discontinuation on word line 1024; the remainders of word line 1024, e.g., in the space between cut structure 1012 and slit structure 1008 in the bit line direction, still remain to maintain the electrical path, according to some implementations.

Similar to cut structures 612, cut structure 1012 can include a dielectric portion including interleaved first dielectric layers 1022 and second dielectric layers 1026 different from first dielectric layers 1022. That is, dielectric layers 1022 of memory stack 1020 remain as first dielectric layers 1022 in the dielectric portion of cut structure 1012, while conductive layers (word lines) 1024 of memory stack 1020 are replaced with second dielectric layers 1026 in the dielectric portion of cut structure 1012, according to some implementations. In other words, a portion of word line 1024 extending along the x-direction between core array region 1003 and staircase region 1001 is replaced with second dielectric layer 1026 of cut structure 1012, according to some implementations. Due to the lower stiffness of the dielectric materials (e.g., silicon nitride) in second dielectric layer 1026 compared with the metal material (e.g., tungsten) in word line 1024, second dielectric layer 1026 can serve as a buffer to release and/or absorb the stress prorogated through word line 1024.

Cut structures 1012 can also divide memory stack 1020 into multiple stack structures. As shown in FIG. 10B, memory stack 1020 of 3D memory device 600 includes a first stack structure 1021 in which the channel structures are formed, according to some implementations. First stack structure 1021 can include interleaved conductive layers 1024 and dielectric layers 1022, and each channel structure can extend vertically through first stack structure 1021. As shown in FIG. 10B, memory stack 1020 of 3D memory device 1000 also includes a second stack structure 1023 and a third stack structure 1025 in which staircase structures 1005 are formed, according to some implementations. First stack structure 1021 is disposed between second stack structure 1023 and third stack structure 1025, according to some implementations. Each of second and third stack structures 1023 and 1025 can also include interleaved conductive layers 1024 and dielectric layers 1022. In some implementations, the edges of interleaved conductive layers 1024 and dielectric layers 1022 of second stack structure 1023 or third stack structure 1025 define the stairs of each staircase structure 1005. In some implementations, the dummy channel structures extend vertically through second and third stack structures 1023 and 1025. As shown in FIG. 10B, memory stack 1020 of 3D memory device 1000 further includes two cut structures 1012 between first stack structure 1021 and second stack structure 1023 as well as between first stack structure 1021 and third stack structure 1025, respectively, such that conductive layers 1024 of first stack structure 1021 are partially separated from conductive layers 1024 of second stack structure 1023 by one cut structure 1012, and conductive layers 1024 of first stack structure 1021 are partially separated from conductive layers 1024 of third stack structure 1025 by another cut structure 1012, according to some implementations. In some implementations, dielectric layers 1022 of first, second, and third stack structures 1021, 1023, and 1025 and dielectric layers 1022 of cut structures 1012 are the same continuous layers and have the same dielectric material, such as silicon oxide.

Figure 11A:
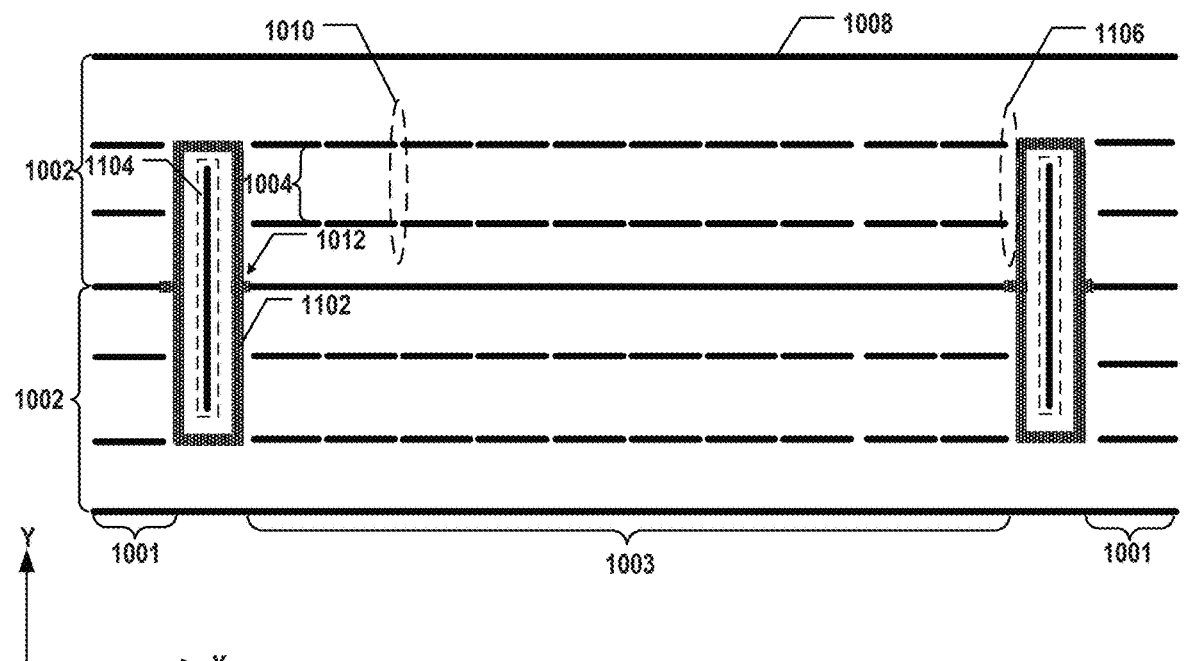
FIG. 11A illustrates a plan view of yet another 3D memory device having a staircase structure, according to some aspects of the present disclosure.
Figure 11B:
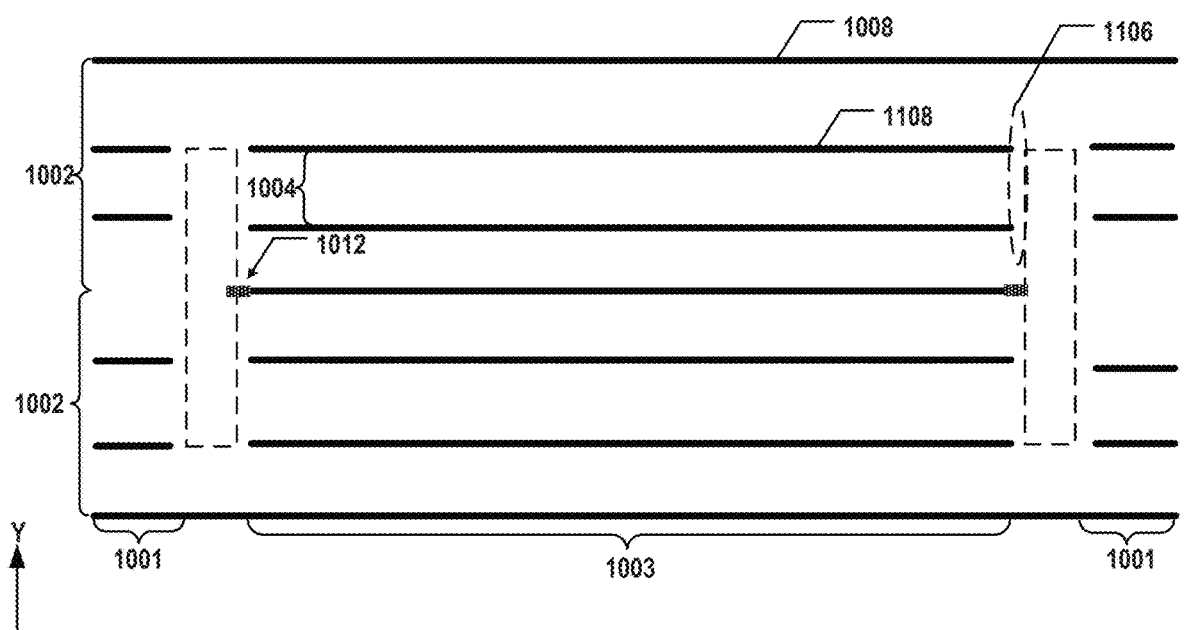
FIG. 11B illustrates a plan view of yet another 3D memory device having a staircase structure, according to some aspects of the present disclosure.

Similar to cut structures 612, the designs of cut structures 1012 are not limited to the example in 3D memory device 1000 and may vary in other 3D memory devices. Any suitable design of cut structures 612 described above may be similarly applied to cut structure 1012. For example, in a 3D memory device 1100 in FIG. 11A, cut structure 1012 may include a dielectric trench 1102 circumscribing interleaved first and second dielectric layers 1022 and 1026. Cut structure 1012 may also include a conductive portion 1104 circumscribed by interleaved first and second dielectric layers 1022 and 1026. As shown in FIG. 11A, spacers 1106 can be formed between cut structure 1012 and slit structures 1108 in the x-direction (the word line direction). That is, cut structure 1012 may be spaced part from slit structure 1108 in the x-direction (the word line direction). Spacers 1106 can be formed in core array region 1003 and staircase region 1001 to further enable the electrical connection of the word line between core array region 1003 and staircase region 1001 It is further understood that the design of slit structures 1008 and "H" cuts 1010 may vary in other examples as well. For example, in a 3D memory device 1101 in FIG. 11B, slit structure 1108 in core array region 1003 may be continuous, i.e., not separated by "H" cuts 1010, in the x-direction (the word line direction). In staircase regions 1001, slit structure 1108 may not be formed between blocks 1002 in 3D memory device 1101 in FIG. 11B.

Figure 14:
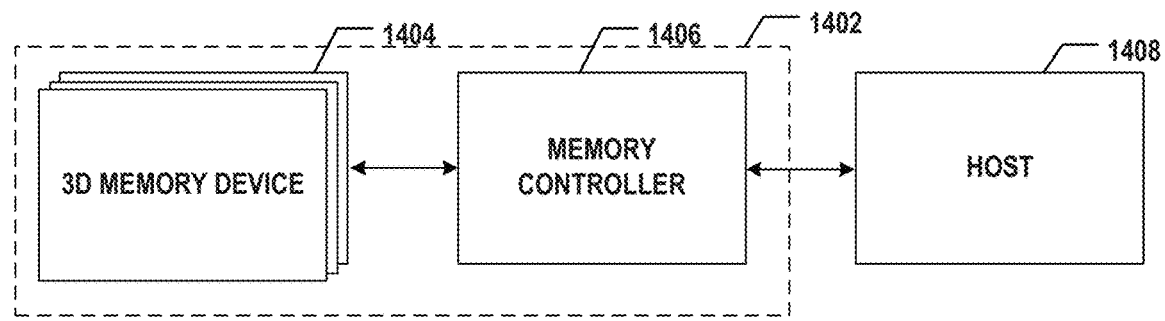
FIG. 14 illustrates a block diagram of an exemplary system having a 3D memory device, according to some aspects of the present disclosure.

FIG. 14 illustrates a block diagram of an exemplary system 1400 having a 3D memory device, according to some aspects of the present disclosure. System 1400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 14, system 1400 can include a host 1408 and a memory system 1402 having one or more 3D memory devices 1404 and a memory controller 1406. Host 1408 can be a processor of an electronic device, such as a central processing unit (CPU), or a system-on-chip (SoC), such as an application processor (AP). Host 1408 can be configured to send or receive data to or from 3D memory devices 1404.

3D memory device 1404 can be any 3D memory device disclosed herein, such as 3D memory devices 600, 700, 800, 900, 1000, and 1100 depicted in FIGS. 6A, 6B, 7A, 7B, 8, 9, 10A, 10B, 11A, and 11B. In some implementations, each 3D memory device 1404 includes a NAND Flash memory. Consistent with the scope of the present disclosure, a cut structure can be formed between the staircase structure and the channel structures to cut off part of the word line that extends between the core array region and the staircase region. Electrical connections between the staircase structures and the channel structures can still be provided by the remainder of the word line. As a result, the stress propagated between the two regions through the word lines can be released, thereby reducing the chance of memory stack collapse and staircase structure shift due to the stress.

Memory controller 1406 (a.k.a., a controller circuit) is coupled to 3D memory device 1404 and host 1408 and is configured to control 3D memory device 1404, according to some implementations. For example, the controller circuit may be configured to operate the plurality of channel structures via the word lines. Memory controller 1406 can manage the data stored in 3D memory device 1404 and communicate with host 1408. In some implementations, memory controller 1406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1406 can be configured to control operations of 3D memory device 1404, such as read, erase, and program operations. Memory controller 1406 can also be configured to manage various functions with respect to the data stored or to be stored in 3D memory device 1404 including, but not limited to bad-block management, garbage collection, logical-to-physical address conversion, wear leveling, etc. In some implementations, memory controller 1406 is further configured to process error correction codes (ECCs) with respect to the data read from or written to 3D memory device 1404. Any other suitable functions may be performed by memory controller 1406 as well, for example, formatting 3D memory device 1404. Memory controller 1406 can communicate with an external device (e.g., host 1408) according to a particular communication protocol. For example, memory controller 1406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 15A, 15B:
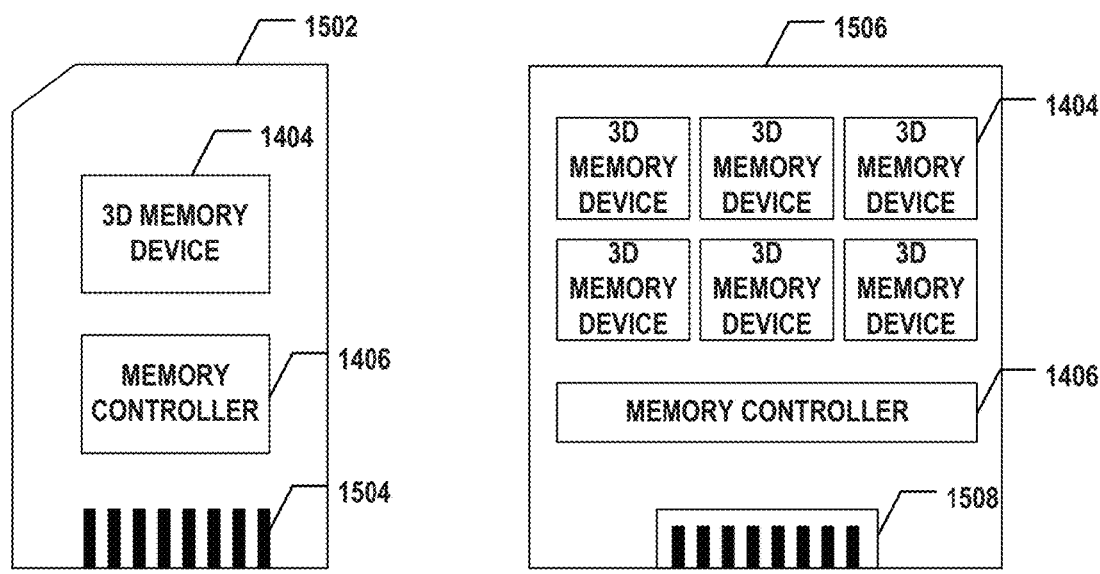
FIG. 15A illustrates a diagram of an exemplary memory card having a 3D memory device, according to some aspects of the present disclosure.
FIG. 15B illustrates a diagram of an exemplary solid-state drive (SSD) having a 3D memory device, according to some aspects of the present disclosure.

Memory controller 1406 and one or more 3D memory devices 1404 can be integrated into various types of storage devices, for example, be included in the same package, such as a universal Flash storage (UFS) package or an eMMC package. That is, memory system 1402 can be implemented and packaged into different types of end electronic products. In one example as shown in FIG. 15A, memory controller 1406 and a single 3D memory device 1404 may be integrated into a memory card 1502. Memory card 1502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1502 can further include a memory card connector 1504 electrically coupling memory card 1502 with a host (e.g., host 1408 in FIG. 14). In another example as shown in FIG. 15B, memory controller 1406 and multiple 3D memory devices 1404 may be integrated into an SSD 1506. SSD 1506 can further include an SSD connector 1508 electrically coupling SSD 1506 with a host (e.g., host 1408 in FIG. 14). In some implementations, the storage capacity and/or the operation speed of SSD 1506 is greater than those of memory card 1502.

FIGS. 12A-12D illustrate a fabrication process for forming an exemplary 3D memory device having a staircase structure, according to some aspects of the present disclosure. FIG. 13 illustrates a flowchart of a method 1300 for forming an exemplary 3D memory device having a staircase structure, according to some implementations of the present disclosure. Examples of the 3D memory device depicted in FIGS. 12A-12D and 13 include 3D memory devices 600, 700, 800, 900, 1000, and 1100 depicted in FIGS. 6A, 6B, 7A, 7B, 8, 9, 10A, 10B, 11A, and 11B. FIGS. 12A-12D and 13 will be described together. It is understood that the operations shown in method 1300 are not exhaustive and that other operations can be performed as well before, after, or between any of the illustrated operations. Further, some of the operations may be performed simultaneously, or in a different order than shown in FIG. 13.

Referring to FIG. 13, method 1300 starts at operation 1302, in which a stack structure including interleaved first dielectric layers and second dielectric layers is formed. The first dielectric layers can include silicon oxide, and the second dielectric layers can include silicon nitride. In some implementations, to form the stack structure, the first dielectric layers and the second dielectric layers are alternatingly deposited above a substrate. The substrate can be a silicon substrate.

Figure 12A:
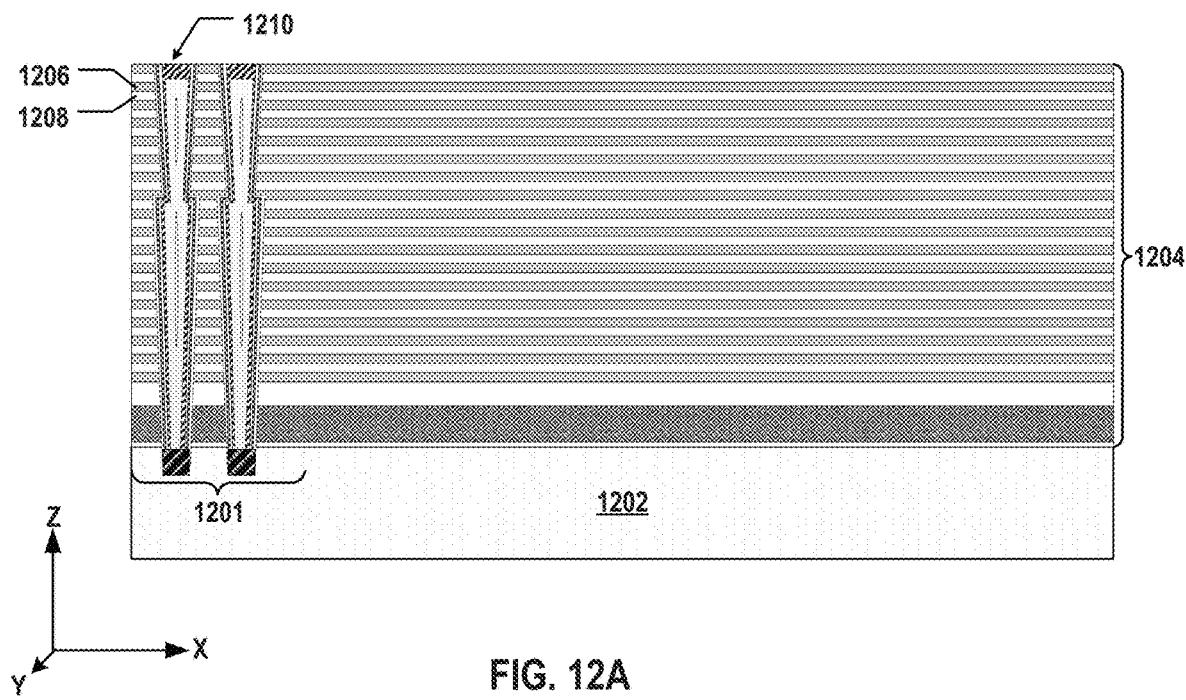
FIGS. 12A-12D illustrate a fabrication process for forming a 3D memory device having a staircase structure, according to some aspects of the present disclosure.
Figure 13:
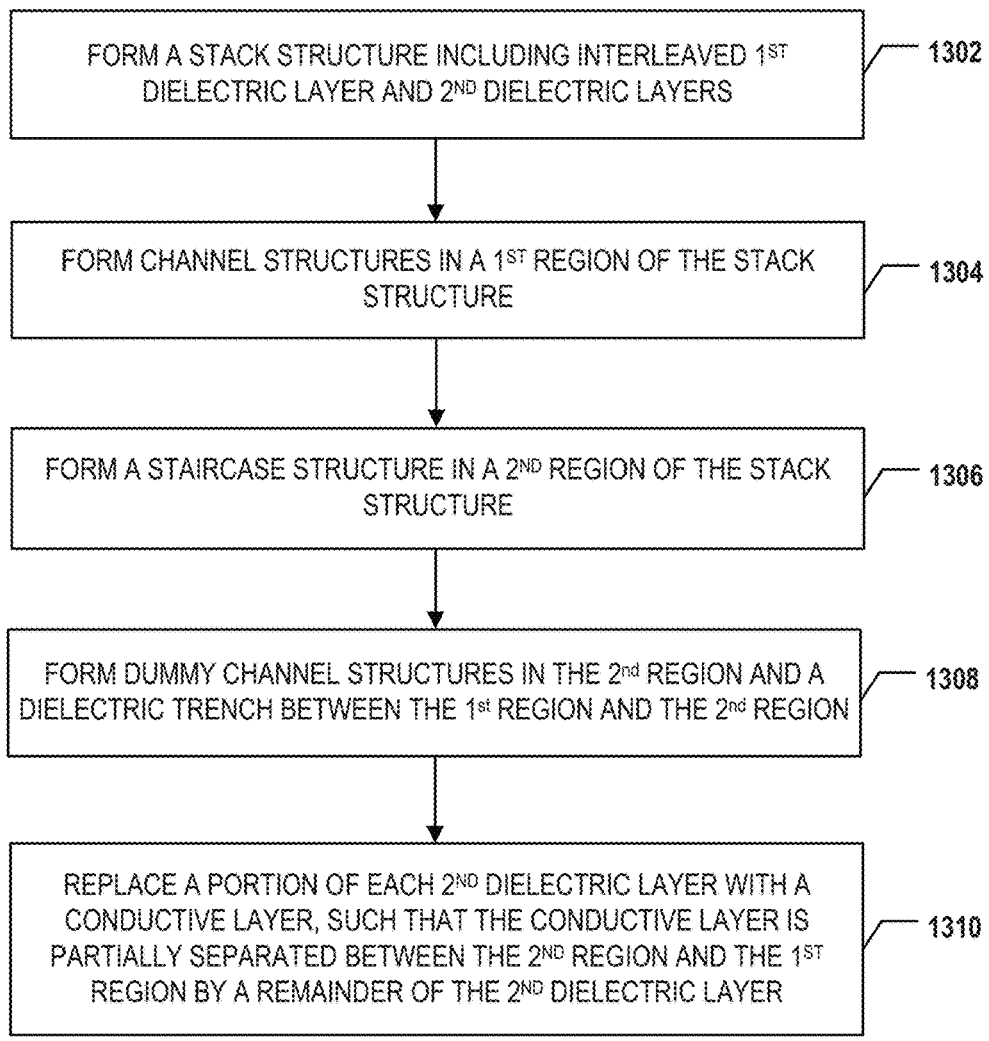
FIG. 13 is a flowchart of a method for forming a 3D memory device having a staircase structure, according to some aspects of the present disclosure.

As illustrated in FIG. 12A, a stack structure (dielectric stack) 1204 including a plurality pairs of a first dielectric layer 1208 and a second dielectric layer 1206 is formed above silicon substrate 1202. Dielectric stack 1204 includes vertically interleaved first dielectric layers 1208 and second dielectric layers 1206, according to some implementations. First and second dielectric layers 1208 and 1206 can be alternatingly deposited above silicon substrate 1202 to form dielectric stack 1204. In some implementations, each first dielectric layer 1208 includes a layer of silicon oxide, and each second dielectric layer 1206 includes a layer of silicon nitride. Dielectric stack 1204 can be formed by one or more thin film deposition processes including, but not limited to, chemical vapor deposition (CVD), physical vapor deposition (PVD), atomic layer deposition (ALD), or any combination thereof.

Method 1300 proceeds to operation 1304, as illustrated in FIG. 13, in which a plurality of channel structures are formed in a first region of the stack structure. Each channel structure can extend vertically through the stack structure. In some implementations, to form the channel structure, a channel hole extending vertically through the stack structure is formed, and a memory film and a semiconductor channel are sequentially formed over a sidewall of the channel hole.

As illustrated in FIG. 12A, channel structures 1210 can be formed in a core array region 1201 of dielectric stack 1204, which can be either in the intermediate (e.g., in 3D memory devices 1000, 1100, and 1101) or on two sides (e.g., in 3D memory devices 600, 700, 800, and 900) of dielectric stack 1204. To form each channel structure 1210, a channel hole (not shown), which is an opening extending vertically through dielectric stack 1204, can be formed first. In some implementations, a plurality of openings are formed, such that each opening becomes the location for growing an individual channel structure 1210 in the later process. In some implementations, fabrication processes for forming the channel hole of channel structure 1210 include wet etching and/or dry etching, such as deep-ion reactive etching (DRIE). As illustrated in FIG. 12A, a memory film (including a blocking layer, a storage layer, and a tunneling layer) and a semiconductor channel are sequentially formed in this order along sidewalls and the bottom surface of the channel hole. In some implementations, the memory film is first deposited along the sidewalls and bottom surface of the channel hole, and the semiconductor channel is then deposited over the memory film. The blocking layer, storage layer, and tunneling layer can be subsequently deposited in this order using one or more thin film deposition processes, such as ALD, CVD, PVD, any other suitable processes, or any combination thereof, to form the memory film. The semiconductor channel can then be formed by depositing a semiconductor material, such as polysilicon, over the tunneling layer of the memory film using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are subsequently deposited to form the memory film and the semiconductor channel of channel structure 1210.

Figure 12B:
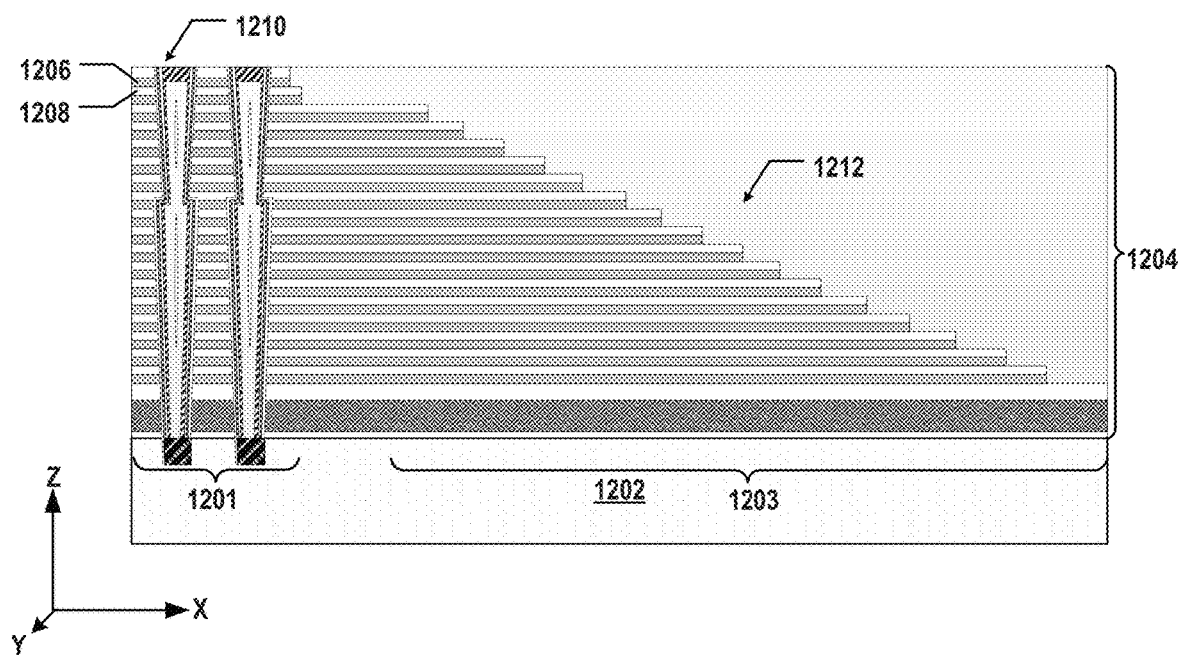

Method 1300 proceeds to operation 1306, as illustrated in FIG. 13, in which a staircase structure is formed in a second region of the stack structure. As illustrated in FIG. 12B, a staircase structure 1212 can be formed in a staircase region 1203 of dielectric stack 1204, which can be either in the intermediate (e.g., in 3D memory devices 600, 700, 800, and 900) or on two sides (e.g., in 3D memory devices 1000, 1100, and 1101) of dielectric stack 1204. Staircase structure 1212 can be formed by performing a plurality of so-called "trim-etch" cycles to the dielectric layer pairs of dielectric stacks 1204 toward silicon substrate 1202. Due to the repeated trim-etch cycles applied to the dielectric layer pairs of dielectric stacks 1204, dielectric stack 1204 can have one or more tilted edges and a top dielectric layer pair shorter than the bottom one as shown in FIG. 12B.

Method 1300 proceeds to operation 1308, as illustrated in FIG. 13, in which a plurality of dummy channel structures in the second region and a dielectric trench are formed. The dummy channel structures and the dielectric trench can be formed in the same process, such that the dielectric trench and the dummy channel structures include the same dielectric material. The dielectric trench can be formed between the first region and the second region.

Figure 12C:
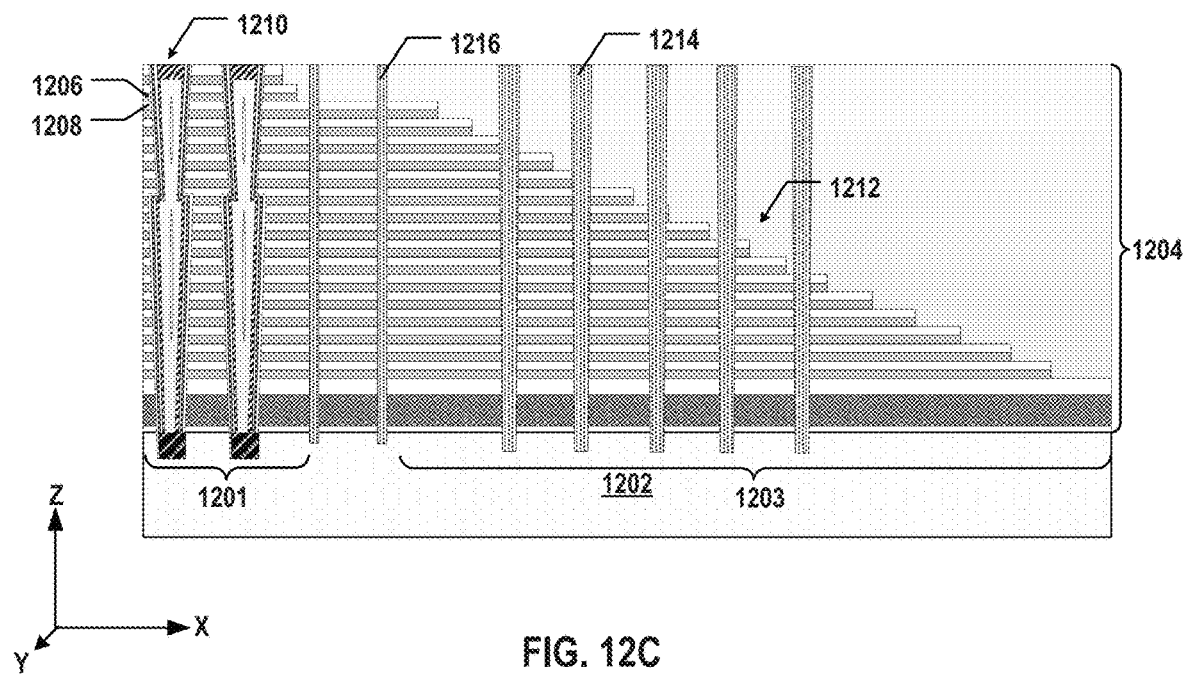

As illustrated in FIG. 12C, dummy channel structures 1214 and a dielectric trench 1216 are formed. Dummy channel structures 1214 can be formed in staircase region 1203 of dielectric stack 1204. Each dummy channel structure 1214 can extend vertically through dielectric stack 1204. Dielectric trench 1216 can be formed between staircase region 1203 and core array region 1201. Dielectric trench 1216 can extend vertically through dielectric stack 1204 as well. In some implementations, dielectric trench 1216 and dummy channel structures 1214 are formed in the same process. To form dielectric trench 1216 and dummy channel structures 1214, a dielectric trench opening and dummy channel holes can be formed through dielectric stack 1204 using wet etching and/or dry etching, such as DIE. A dielectric material, such as silicon oxide, can then be deposited into the dielectric trench opening and dummy channel holes using one or more thin film deposition processes, such as ALD, CVD, PVD, any other suitable processes, or any combination thereof to form dielectric trench 1216 and dummy channel structures 1214. As a result, dielectric trench 1216 and dummy channel structures 1214 can have the same dielectric material, such as silicon oxide. It is understood that in some examples, dielectric trench 1216 may not be formed depending on the design of the cut structures as described above in detail.

Method 1300 proceeds to operation 1310, as illustrated in FIG. 13, in which a first portion of each of the second dielectric layers is replaced with a conductive layer, such that the conductive layer is partially separated between the staircase structure and the plurality of channel structures by a remainder of the second dielectric layer. The conductive layer can include a metal. In some implementations, the dielectric trench circumscribes the remainder of the second dielectric layer. In some implementations, to replace the first portion of each second dielectric layer, a first slit opening and a second slit opening are formed in the first region and the second region, respectively, the first portion of each second dielectric layer is removed through the first and second slit openings to form a recess, and the conductive layer is deposited into the recess through the first and second slit openings. In some implementations, a second portion of each second dielectric layer is replaced with the conductive layer in the same process of replacing the first portion of each second dielectric layer. The second portion of the second dielectric layer can be circumscribed by the remainder of the second dielectric layer.

Figure 12D:
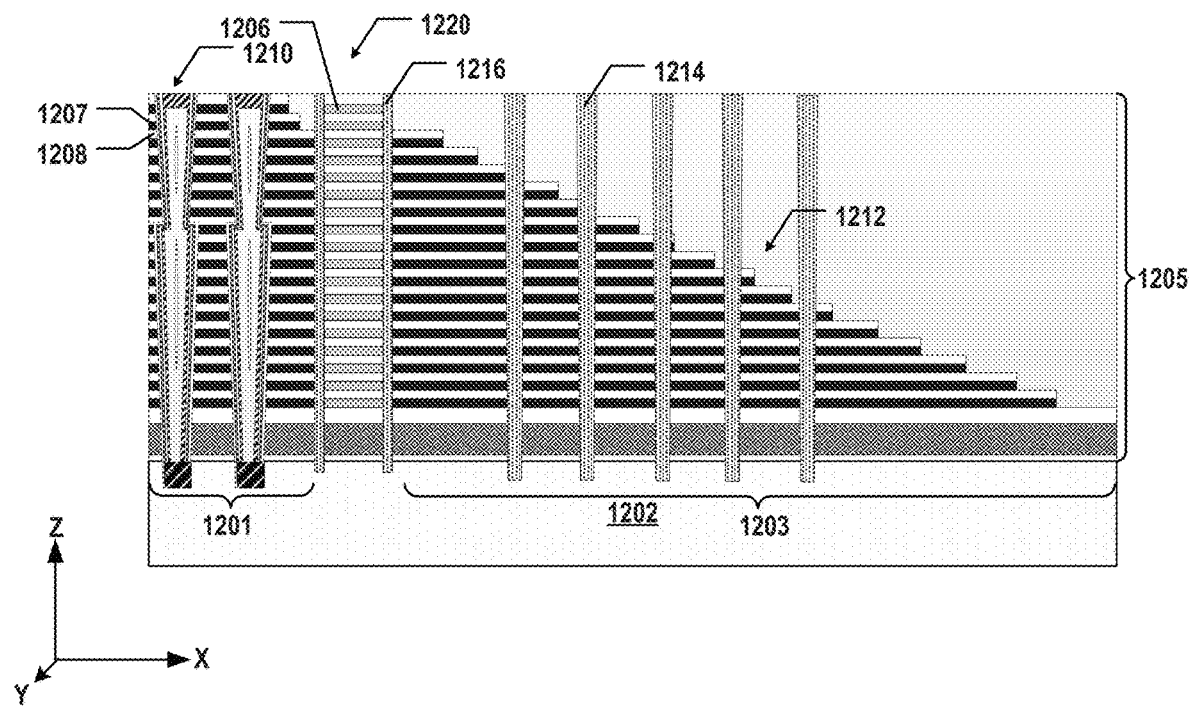

As illustrated in FIG. 12D, portions of each second dielectric layer 1206 (e.g., in FIG. 12C) that are in core array region 1201 and staircase region 1203 are replaced with conductive layers 1207 using a gate-replacement process, such that conductive layers 1207 are partially separated between channel structures 1210 and staircase structures 1212 by the remainders of second dielectric layers 1206 circumscribed by dielectric trench 1216. A cut structure 1220 including dielectric trench 1216 and interleaved first dielectric layers 1208 and the remainders of second dielectric layers 1206 are thereby formed between core array region 1201 and staircase region 1203, according to some implementations. Although not shown in FIG. 12D, it is understood that in some examples, portions of each second dielectric layer 1206 that are inside cut structure 1220 (e.g., surrounded by dielectric trench 1216) may be replaced with conductive layers 1207 as well, such that conductive layers 1207 inside cut structure 1220 (e.g., between core array region 1201 and staircase region 1203) may be circumscribed by the remainders of second dielectric layers 1206. Nevertheless, conductive layers 1207 inside cut structure 1220 may be discontinuous from conductive layers in core array region 1201 and staircase region 1203. Dielectric stack 1204 (e.g., in FIG. 12C) is thereby replaced by a memory stack 1205, according to some implementations.

The gate-replacement process can include forming slit openings (not shown in FIG. 12D, e.g., corresponding to slit structures 608 and 1008) in core array region 1201 and staircase region 1203, but not in the region therebetween in which cut structure 1220 is to be formed (e.g., within dielectric trench 1216). Each slit opening can extend vertically through dielectric stack 1204. In some implementations, pseudo-slit openings (not shown in FIG. 12D, e.g., corresponding to pseudo-slit structures 804 and 904) are formed inside the region in which cut structure 1220 is to be formed (e.g., within dielectric trench 1216). In some implementations, fabrication processes for forming the slit openings and pseudo-slit openings include wet etching and/or dry etching, such as DRIE, through dielectric stack 1204.

The gate-replacement process can then include removing portions of each second dielectric layer 1206 (e.g., in FIG. 12C), which are in core array region 1201 and staircase region 1203, through the slit openings to form recesses (not shown), leaving the remainders of each second dielectric layer 1206 inside cut structure 1220 intact (e.g., between core array region 1201 and staircase region 1203 and circumscribed by dielectric trench 1216). It is understood that in some examples, portions of each second dielectric layer 1206 inside cut structure 1220 may be removed through the pseudo-slit openings as well. In some implementations, the wet etchant can be applied from the slit openings (and the pseudo-slit openings in some examples) to remove parts of second dielectric layers 1206. By controlling the etching rate and/or etching time, the wet etchant does not travel all the way to completely remove second dielectric layers 1206, leaving the remainders of second dielectric layer 1206 between core array region 1201 and staircase region 1203 (e.g., inside cut structure 1220 and circumscribed by dielectric trench 1216).

The gate-replacement process can further include depositing conductive layers into the recesses through the slit openings. As illustrated in FIG. 12D, conductive layers 1207 (including gate electrodes and adhesive layers) are deposited into the recesses (not shown) through the slit openings (and the pseudo-slit openings in some examples). In some implementations, a gate dielectric layer is deposited into the recesses prior to conductive layers 1207, such that conductive layers 1207 are deposited on the gate dielectric layer. Conductive layers 1207, such as metal layers, can be deposited using one or more thin film deposition processes, such as ALD, CVD, PVD, any other suitable processes, or any combination thereof. In some implementations, conductive layers 1207 fully fill the recesses and thus, are in contact with dielectric trench 1216 (as shown in FIG. 12D) or the remainders of second dielectric layers 1206, respectively (in the examples in which dielectric trench 1216 is not formed), after depositing conductive layers 1207.

According to one aspect of the present disclosure, a 3D memory device includes a plurality of channel structures in a first region, a staircase structure in a second region, and a word line extending in the first region and the second region. The first region and the second region are arranged along a first direction. The word line is discontinuous in the first direction between the first region and the second region.

In some implementations, the 3D memory device further includes a cut structure between the staircase structure and the plurality of channel structures. In some implementations, the cut structure cuts off a part of the word line extending along the first direction between the first region and the second region.

In some implementations, the cut structure includes a dielectric portion including interleaved first dielectric layers and second dielectric layers.

In some implementations, the first dielectric layers include silicon oxide, and the second dielectric layers include silicon nitride.

In some implementations, the dielectric portion of the cut structure further includes a dielectric trench circumscribing the interleaved first and second dielectric layers.

In some implementations, the 3D memory device further includes a plurality of dummy channel structures in the second region. In some implementations, the dielectric trench and the dummy channel structures include a same dielectric material.

In some implementations, the cut structure further includes a conductive portion circumscribed by the interleaved first and second dielectric layers.

In some implementations, the conductive portion and the word line include a same conductive material.

In some implementations, the 3D memory device further includes a bridge structure in the second region. In some implementations, the bridge structure and the staircase structure are disposed along a second direction perpendicular to the first direction. In some implementations, the word line extends between the channel structures and the staircase structure through the bridge structure.

In some implementations, the cut structure contacts the bridge structure along the second direction.

In some implementations, the 3D memory device further includes a slit structure extending along the first direction in the first region and the second region. In some implementations, the cut structure is spaced apart from the slit structure along a second direction perpendicular to the first direction.

According to another aspect of the present disclosure, a 3D memory device includes a first stack structure including interleaved first conductive layers and first dielectric layers, a plurality of channel structures extending through the first stack structure, a second stack structure including interleaved second conductive layers and second dielectric layers, and a first cut structure between the first stack structure and the second stack structure. Edges of the interleaved second conductive layers and second dielectric layers of the second stack structure define a staircase. The first conductive layers of the first stack structure are partially separated from the second conductive layers of the second stack structure by the first cut structure.

In some implementations, the first cut structure includes a dielectric portion including interleaved third dielectric layers and fourth dielectric layers.

In some implementations, the dielectric portion of the first cut structure further includes a dielectric trench circumscribing the interleaved third and fourth dielectric layers.

In some implementations, the 3D memory device further includes a plurality of dummy channel structures extending through the second stack structure. In some implementations, the dielectric trench and the dummy channel structures comprise a same dielectric material.

In some implementations, the first cut structure further includes a conductive portion circumscribed by the interleaved third and fourth dielectric layers.

In some implementations, the conductive portion and the first and second conductive layers of the first and second stack structures include a same conductive material.

In some implementations, the first dielectric layers of the first cut structure and the first and second dielectric layers of the first and second stack structures include a same dielectric material.

In some implementations, the 3D memory device further includes a third stack structure including interleaved third conductive layers and fifth dielectric layers, a plurality of channel structures extending through the third stack structure, and a second cut structure between the third stack structure and the second stack structure. In some implementations, the third conductive layers of the third stack structure are partially separated from the second conductive layers of the second stack structure by the second cut structure.

In some implementations, the second stack structure is disposed between the first and third stack structures.

In some implementations, the 3D memory device further includes a bridge structure including interleaved fourth conductive layers and sixth dielectric layers. In some implementations, the second conductive layers of the second stack structure are connected to the first conductive layers of the first stack structure through the fourth conductive layers of the bridge structure.

In some implementations, the 3D memory device further includes a fourth stack structure including interleaved fifth conductive layers and seventh dielectric layers, and a third cut structure between the first stack structure and the fourth stack structure. In some implementations, edges of the interleaved fifth conductive layers and seventh dielectric layers of the fourth stack structure define another staircase. In some implementations, the first conductive layers of the first stack structure are partially separated from the fifth conductive layers of the fourth stack structure by the third cut structure.

In some implementations, the first stack structure is disposed between the second and fourth stack structures.

According to still another aspect of the present disclosure, a system includes a 3D memory device configured to store data. The 3D memory device includes a plurality of channel structures in a first region, a staircase structure in a second region, and a word line extending in the first region and the second region. The first region and the second region are arranged along a first direction. The word line is discontinuous in the first direction between the first region and the second region. The system also includes a controller circuit coupled to the 3D memory device and configured to operate the plurality of channel structures via the word line.

According to yet another aspect of the present disclosure, a method for forming a staircase structure of a 3D memory device is disclosed. A stack structure includes interleaved first dielectric layers and second dielectric layers is formed. A plurality of channel structures are formed in a first region of the stack structure. A staircase structure is formed in a second region of the stack structure. A first portion of each of the second dielectric layers is replaced with a conductive layer, such that the conductive layer is partially separated between the staircase structure and the plurality of channel structures by a remainder of the second dielectric layer.

In some implementations, prior to replacing, a dielectric trench circumscribing the remainder of the second dielectric layer is formed.

In some implementations, a plurality of dummy channel structures are formed in the second region in a same process of forming the dielectric trench, such that the dielectric trench and the dummy channel structures comprise a same dielectric material.

In some implementations, a second portion of each second dielectric layer is replaced with the conductive layer in a same process of replacing the first portion of each second dielectric layer. In some implementations, the second portion of the second dielectric layer is circumscribed by the remainder of the second dielectric layer.

In some implementations, to replace the first portion of each second dielectric layer, a first slit opening and a second slit opening are formed in the first region and the second region, respectively, the first portion of each second dielectric layer is removed through the first and second slit openings to form a recess, and the conductive layer is deposited into the recess through the first and second slit openings.

In some implementations, the first dielectric layers include silicon oxide, and the second dielectric layers include silicon nitride.

In some implementations, the conductive layer includes a metal.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a plurality of channel structures in a first region;
   a staircase structure in a second region, the first region and the second region being arranged along a first direction; and
   a word line extending in the first region and the second region; and
   a cut structure between the staircase structure and the plurality of channel structures, wherein the cut structure cuts off a part of the word line extending along the first direction between the first region and the second region, wherein the cut structure comprises a dielectric portion comprising interleaved first dielectric layers and second dielectric layers.

2. The 3D memory device of claim 1, wherein the first dielectric layers comprise silicon oxide, and the second dielectric layers comprise silicon nitride.

3. The 3D memory device of claim 1, wherein the dielectric portion of the cut structure further comprises a dielectric trench circumscribing the interleaved first and second dielectric layers.

4. The 3D memory device of claim 3, further comprising a plurality of dummy channel structures in the second region, wherein the dielectric trench and the dummy channel structures comprise a same dielectric material.

5. The 3D memory device of claim 1, wherein the cut structure further comprises a conductive portion circumscribed by the interleaved first and second dielectric layers.

6. The 3D memory device of claim 5, wherein the conductive portion and the word line comprise a same conductive material.

7. The 3D memory device of claim 1, further comprising a bridge structure in the second region,
   wherein the bridge structure and the staircase structure are disposed along a second direction perpendicular to the first direction; and
   the word line extends between the channel structures and the staircase structure through the bridge structure.

8. The 3D memory device of claim 7, wherein the cut structure contacts the bridge structure along the second direction.

9. The 3D memory device of claim 1, further comprising a slit structure extending along the first direction in the first region and the second region,
wherein the cut structure is spaced apart from the slit structure along a second direction perpendicular to the first direction.

10. A three-dimensional (3D) memory device, comprising:
a first stack structure comprising interleaved first conductive layers and first dielectric layers;
a plurality of channel structures extending through the first stack structure;
a second stack structure comprising interleaved second conductive layers and second dielectric layers, wherein edges of the interleaved second conductive layers and second dielectric layers of the second stack structure define a plurality of stairs;
a first cut structure between the first stack structure and the second stack structure, wherein the first conductive layers of the first stack structure are partially separated from the second conductive layers of the second stack structure by the first cut structure; and
a bridge structure comprising interleaved fourth conductive layers and sixth dielectric layers, wherein the second conductive layers of the second stack structure are connected to the first conductive layers of the first stack structure through the fourth conductive layers of the bridge structure.

11. The 3D memory device of claim 10, further comprising:
a third stack structure comprising interleaved third conductive layers and fifth dielectric layers;
a plurality of channel structures extending through the third stack structure; and
a second cut structure between the third stack structure and the second stack structure,
wherein the third conductive layers of the third stack structure are partially separated from the second conductive layers of the second stack structure by the second cut structure.

12. The 3D memory device of claim 10, further comprising:
a fourth stack structure comprising interleaved fifth conductive layers and seventh dielectric layers, wherein edges of the interleaved fifth conductive layers and seventh dielectric layers of the fourth stack structure define another plurality of stairs; and
a third cut structure between the first stack structure and the fourth stack structure,
wherein the first conductive layers of the first stack structure are partially separated from the fifth conductive layers of the fourth stack structure by the third cut structure.

13. The 3D memory device of claim 10, wherein the first cut structure comprises:
interleaved third dielectric layers and fourth dielectric layers; and
a dielectric structure laterally surrounding the interleaved third dielectric layers and fourth dielectric layers.

14. The 3D memory device of claim 13, the first cut structure further comprises a plurality of dummy channel structures each vertically extending through the interleaved third dielectric layers and fourth dielectric layers.

15. The 3D memory device of claim 13, wherein the first cut structure further comprises a conductive portion laterally surrounded by the interleaved third dielectric layers and fourth dielectric layers.

16. A three-dimensional (3D) memory device, comprising:
a stack structure comprising interleaved conductive layers and first dielectric layers;
a plurality of channel structures vertically extending through the stack structure in an array region;
a staircase structure defined by edges of the interleaved conductive layers and dielectric layers stack structure of the stack structure in a staircase region; and
a cut structure comprising interleaved first dielectric layers and second dielectric layers, and vertically extending through the stack structure and between the array region and the staircase region.

17. The 3D memory device of claim 16, wherein a first portion of the conductive layers in the array region are electrically connected to a second portion of the conductive layers in the staircase region through a third portion of the conductive layers in a bridge region.

18. The 3D memory device of claim 16, wherein the cut structure further comprises a dielectric structure laterally surrounding the interleaved first dielectric layers and second dielectric layers.

19. The 3D memory device of claim 18, the cut structure further comprises a plurality of dummy channel structures each vertically extending through the interleaved first dielectric layers and second dielectric layers.

20. The 3D memory device of claim 18, wherein the cut structure further comprises a conductive portion laterally surrounded by the interleaved first dielectric layers and second dielectric layers.

* * * * *